US012776386B2

(12) United States Patent
Jin

(10) Patent No.: US 12,776,386 B2
(45) Date of Patent: Oct. 27, 2026

(54) MEMORY DEVICE AND OPERATING METHOD THEREOF, MEMORY SYSTEM

(71) Applicant: YANGTZE MEMORY TECHNOLOGIES CO., LTD., Wuhan (CN)

(72) Inventor: Chong Jin, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 97 days.

(21) Appl. No.: 18/807,523

(22) Filed: Aug. 16, 2024

(65) Prior Publication Data

US 2025/0336468 A1 Oct. 30, 2025

(51) Int. Cl.
*G11C 29/00* (2006.01)

(52) U.S. Cl.
CPC ............ *G11C 29/76* (2013.01); *G11C 29/781* (2013.01); *G11C 29/789* (2013.01)

(58) Field of Classification Search
CPC ...... G11C 29/76; G11C 29/781; G11C 29/789
USPC ............................................ 365/185.09, 200
See application file for complete search history.

(56) References Cited

U.S. PATENT DOCUMENTS 4,752,914 A * 6/1988 Nakano ................ G11C 29/835 365/225.7
6,275,406 B1 * 8/2001 Gibson .................. G11C 15/04 365/49.17
6,634,003 B1 * 10/2003 Phan ...................... G11C 29/76 365/45
7,426,141 B2 * 9/2008 Takeuchi ........... G11C 16/0483 365/185.11
7,894,281 B2 * 2/2011 Park ..................... G11C 29/846 365/225.7
10,803,974 B1 * 10/2020 Tang ...................... G11C 29/30
11,211,142 B2 * 12/2021 Shih ....................... G11C 29/44
2013/0155794 A1 * 6/2013 Wu ........................ G11C 29/76 365/200
2015/0003138 A1 * 1/2015 Wada ..................... G11C 15/00 365/49.17
2020/0227133 A1 * 7/2020 Shih ..................... G11C 29/765
(Continued)

FOREIGN PATENT DOCUMENTS

CN 103177771 A * 6/2013 ............. G11C 29/72
CN 111627487 A * 9/2020 ........... G11C 29/838
(Continued)

*Primary Examiner* — Michael T Tran
(74) *Attorney, Agent, or Firm* — Conley Rose, P.C.

(57) ABSTRACT

Examples of the present application provide a memory device and operating method thereof and a memory system. Wherein the memory device includes: a first memory bank and a second memory bank; a redundancy analysis circuit includes: a redundancy circuit which stores invalid address information for the first memory bank and the second memory bank; and is configured to output an invalid address signal, the invalid address signal includes invalid address information for the first memory bank or the second memory bank; a matching circuit coupled to the redundancy circuit and configured to receive a to-be-activated address signal and the invalid address signal, and match the to-be-activated address information in the to-be-activated address signal with the invalid address information in the invalid address signal, and output a matching address signal.

20 Claims, 17 Drawing Sheets

(56) References Cited

U.S. PATENT DOCUMENTS

| | | | | |
|---|---|---|---|---|
| 2022/0028471 | A1* | 1/2022 | Shang .................... | G11C 29/36 |
| 2023/0343409 | A1* | 10/2023 | Eichmeyer ........... | G11C 29/787 |

FOREIGN PATENT DOCUMENTS

| | | | | | |
|---|---|---|---|---|---|
| CN | 112908397 | A * | 6/2021 | ............. | G11C 29/72 |
| WO | WO-2022226997 | A1 * | 11/2022 | ............. | G11C 29/76 |

* cited by examiner

MEMORY DEVICE AND OPERATING METHOD THEREOF, MEMORY SYSTEM

CROSS-REFERENCE TO RELATED APPLICATIONS

The present application claims priority to Chinese Patent Application No. 2024105216114, which was filed Apr. 26, 2024, is titled "MEMORY DEVICE AND ITS OPERATING METHOD, MEMORY SYSTEM," and is hereby incorporated herein by reference in its entirety.

TECHNICAL FIELD

Examples of the present application relate to the field of semiconductor technology, and in particular to a memory device and operating method thereof, a memory system.

BACKGROUND

A memory device and its system are storage devices used to store information in modern information technology. As people's requirements for a storage device continue to increase, there is much room for improvement in the memory device and its system.

SUMMARY

In view of this, examples of the present application provide a memory device, an operating method thereof and a memory system.

In a first aspect, an example of the present application provides a memory device, the memory device includes: a first memory bank and a second memory bank; and, a redundancy analysis circuit coupled to both the first memory bank and the second memory bank; wherein the redundancy analysis circuit includes: a redundancy circuit which stores invalid address information for the first memory bank and the second memory bank, and is configured to output an invalid address signal according to an enable signal of the first memory bank or the second memory bank, the invalid address signal includes invalid address information for the first memory bank or the second memory bank; a matching circuit coupled to the redundancy circuit and configured to receive a to-be-activated address signal and the invalid address signal, and to match the to-be-activated address information in the to-be-activated address signal with the invalid address information in the invalid address signal, and output a matching address signal.

In some examples, the memory device further includes a decoding circuit, a first register, and a second register; the decoding circuit includes a first decoding circuit; wherein the first decoding circuit is coupled to the redundancy analysis circuit and is configured to receive the to-be-activated address signal and the matching address signal, and generate a first decoding signal according to the to-be-activated address signal and the matching address signal; the first decoding signal including at least one of to-be-activated normal address information or to-be-activated redundancy address information for the first memory bank/the second memory bank; the first register is coupled to the first decoding circuit, and is configured to store the first decoding signal in response to the enable signal of the first memory bank being in an enable state; the second register is coupled to the first decoding circuit, and is configured to store the first decoding signal in response to the enable signal of the second memory bank being in an enable state.

In some examples, the first memory bank is configured to be activated in response to the second register completing the storing of the first decoding signal; or the second memory bank is configured to be activated in response to the first register completing the storing of the first decoding signal.

In some examples, the to-be-activated address signal includes a first signal or a second signal, and the first signal includes to-be-activated address information for the first memory bank, the second signal includes to-be-activated address information for the second memory bank; the first decoding signal includes a third signal or a fourth signal, the third signal includes at least one of to-be-activated normal address information or to-be-activated redundancy address information for the first memory bank, the fourth signal includes at least one of to-be-activated normal address information or to-be-activated redundancy address information for the second memory bank; the redundancy analysis circuit is configured to receive and store the first signal, and in response to the first register completing the storing of the third signal, receive and store the second signal/the first signal at a next time, the first decoding circuit is configured to generate the fourth signal/the third signal; or the redundancy analysis circuit is configured to receive and store the second signal, and in response to the second register completing the storing of the fourth signal, receive and store the first signal/the second signal, the first decoding circuit is configured to generate the third signal/the fourth signal.

In some examples, the memory device further includes a decoding circuit; the decoding circuit includes a second decoding circuit and a third decoding circuit; wherein the second decoding circuit is coupled to the redundancy analysis circuit and is configured to, in response to the enable signal of the first memory bank being in the enable state, receive the to-be-activated address signal and the matching address signal, and generate a second decoding signal according to the to-be-activated address signal and the matching address signal; the second decoding signal including at least one of to-be-activated normal address information or to-be-activated redundancy address information for the first memory bank; the third decoding circuit is coupled to the redundancy analysis circuit and is configured to, in response to the enable signal of the second memory bank being in the enable state, receive the to-be-activated address signal and the matching address signal, and generate a third decoding signal according to the to-be-activated address signal and the matching address signal; the third decoding signal including at least one of to-be-activated normal address information or to-be-activated redundancy address information for the second memory bank.

In some examples, the redundancy analysis circuit includes a row redundancy analysis circuit, the row redundancy analysis circuit including a row redundancy circuit and a row matching circuit; wherein the row redundancy circuit is configured to: store corresponding invalid row address information for the first memory bank and the second memory bank respectively, and output an invalid row address signal including invalid row address information corresponding to one to-be-activated memory bank from the first memory bank and the second memory bank; the row matching circuit is configured to receive a to-be-activated row address signal, and match the to-be-activated row address information in the to-be-activated row address signal with the invalid row address information in the invalid row address signal, and output a matching row signal; the decoding circuit including a row decoding circuit, configured to: receive the to-be-activated row address signal and the matching row signal, and generate a first row decoding signal/a second row decoding signal/a third row decoding signal according to the to-be-activated row address signal and the matching row signal; the first row decoding signal/the second row decoding signal/the third row decoding signal including at least one of to-be-activated row address information or to-be-activated redundancy row address information for the first memory bank/the second memory bank.

In some examples, the row redundancy circuit includes a first latch circuit and a second latch circuit; the row matching circuit includes a comparison circuit; the first latch circuit storing a first invalid row address signal and configured to output the stored first invalid row address signal in response to an enable state of a first read signal; or, the second latch circuit storing a second invalid row address signal and configured to output the stored second invalid row address signal in response to an enable state of a second read signal; the comparison circuit is configured to receive the to-be-activated row address signal and the first invalid row address signal/the second invalid row address signal, and generate the matching row signal.

In some examples, the first latch circuit is further configured to store the to-be-stored first invalid row address signal in response to the enable state of the first write signal; or the second latch circuit is further configured to store the to-be-stored second invalid row address signal in response to the enable state of the second write signal.

In some examples, the memory device further includes a control circuit configured to: generate the first read signal in response to an enable signal of the first memory bank, or generate the second read signal in response to an enable signal of the second memory bank.

In some examples, the control circuit is further configured to: in response to an invalid row occurring in normal rows in the first memory bank, generate the to-be-stored first invalid row address signal corresponding to the invalid row in the first memory bank and the first write signal, or in response to an invalid row occurring in normal rows in the second memory bank, generate the to-be-stored second invalid row address signal corresponding to the invalid row in the second memory bank and the second write signal.

In some examples, the first latch circuit includes a first gating circuit, a first latch, and a second gating circuit; the second latch circuit includes a third gating circuit, a second latch, and a fourth gating circuit; the first gating circuit is configured to: receive the to-be-stored first invalid row address signal and the first write signal, and in response to the enable state of the first write signal, transmit the to-be-stored first invalid row address signal to the first latch; the first latch is configured to receive and store the to-be-stored first invalid row address signal/output the stored first invalid row address signal; the second gating circuit is configured to: receive the first invalid row address signal stored in the first latch and the first read signal, and in response to the enable state of the first read signal, transmit the first invalid row address signal stored in the first latch to the comparison circuit; or the third gating circuit is configured to: receive the to-be-stored second invalid row address signal and the second write signal, and in response to the enable state of the second write signal, transmit the to-be-stored second invalid row address signal to the second latch; the second latch is configured to receive and store the to-be-stored second invalid row address signal/output the stored second invalid row address signal; the fourth gating circuit is configured to: receive the second invalid row address signal stored in the second latch and the second read signal, and in response to the enable state of the second read signal, transmit the second invalid row address signal stored in the second latch to the comparison circuit.

In some examples, the comparison circuit includes a transmission gate and a fifth gating circuit; the transmission gate is configured to receive the to-be-activated row address signal and the first invalid row address signal/the second invalid row address signal, and generate a first state of the matching row signal in response to an enable state of the first invalid row address signal/the second invalid row address signal; the first state of the matching row signal representing an invalid row address matching the first invalid row address/the second invalid row address being included in the to-be-activated row address; the fifth gating circuit is configured to receive a reverse signal of the to-be-activated row address signal and the first invalid row address signal/the second invalid row address signal, in response to an enable state of the reverse signal of the first invalid row address signal/the second invalid row address signal, the generated matching row signal is in a second state; the second state of the matching row signal representing an invalid row address matching the first invalid row address/the second invalid row address not being included in the to-be-activated row address.

In some examples, the memory device further includes a first word line driver, a second word line driver, a third word line driver, and a fourth word line driver; the first word line driver is configured to receive the output signal of the decoding circuit, generate a first driving signal; the first driving signal is for driving a normal row in the first memory bank; and/or, the second word line driver is configured to receive the output signal of the decoding circuit, generate a second driving signal; the second driving signal is for driving a redundancy row in the first memory bank; the third word line driver is configured to receive the output signal of the decoding circuit, generate a third driving signal; the third driving signal is for driving a normal row in the second memory bank; and/or, the fourth word line driver is configured to receive the output signal of the decoding circuit, generate a fourth driving signal; the fourth driving signal is for driving a redundancy row in the second memory bank.

In a second aspect, an example of the present application provides a memory device, the memory device includes: a first memory bank and a second memory bank arranged adjacently; and a redundancy analysis circuit located between the first memory bank and the second memory bank and coupled to both the first memory bank and the second memory bank; wherein the redundancy analysis circuit includes: a redundancy circuit which stores invalid address information for the first memory bank and the second memory bank and is configured to output an invalid address signal according to an enable signal of the first memory bank or the second memory bank, the invalid address signal including invalid address information for the first memory bank or the second memory bank; a matching circuit coupled to the redundancy circuit and configured to receive a to-be-activated address signal and the invalid address signal, and to match the to-be-activated address information in the to-be-activated address signal with the invalid address information in the invalid address signal, and output a matching address signal.

In some examples, the memory device further includes a decoding circuit, a first register, and a second register; the decoding circuit includes a first decoding circuit; wherein the first decoding circuit is located between the first memory bank and the second memory bank and coupled to the redundancy analysis circuit and is configured to receive the to-be-activated address signal and the matching address signal, and generate a first decoding signal according to the to-be-activated address signal and the matching address signal; the first decoding signal including at least one of to-be-activated normal address information or to-be-activated redundancy address information for the first memory bank/the second memory bank; the first register is located between the redundancy analysis circuit, the first decoding circuit and the first memory bank and coupled to the first decoding circuit, and is configured to store the first decoding signal in response to the enable signal of the first memory bank being in an enable state; the second register is located between the redundancy analysis circuit, the first decoding circuit and the second memory bank and coupled to the first decoding circuit, and is configured to store the first decoding signal in response to the enable signal of the second memory bank being in an enable state.

In some examples, the memory device further includes a first word line driver and a second word line driver which are located between the first register and the first memory bank, and a third word line driver and a fourth word line driver which are located between the second register and the second memory bank; the first word line driver is configured to receive the output signal of the decoding circuit, generate a first driving signal; the first driving signal is for driving a normal row in the first memory bank; and/or, the second word line driver is configured to receive the output signal of the decoding circuit, generate a second driving signal; the second driving signal is for driving a redundancy row in the first memory bank; the third word line driver is configured to receive the output signal of the decoding circuit, generate a third driving signal; the third driving signal is for driving a normal row in the second memory bank; and/or, the fourth word line driver is configured to receive the output signal of the decoding circuit, generate a fourth driving signal; the fourth driving signal is for driving a redundancy row in the second memory bank.

In some examples, the memory device further includes a decoding circuit; the decoding circuit includes a second decoding circuit and a third decoding circuit; wherein the second decoding circuit is located between the first memory bank and the second memory bank and coupled to the redundancy analysis circuit and is configured to, in response to the enable signal of the first memory bank being in the enable state, receive the to-be-activated address signal and the matching address signal, and generate a second decoding signal according to the to-be-activated address signal and the matching address signal; the second decoding signal including at least one of to-be-activated normal address information or to-be-activated redundancy address information for the first memory bank; the third decoding circuit is located between the first memory bank and the second memory bank and coupled to the redundancy analysis circuit and is configured to, in response to the enable signal of the second memory bank being in the enable state, receive the to-be-activated address signal and the matching address signal, and generate a third decoding signal according to the to-be-activated address signal and the matching address signal; the third decoding signal including at least one of to-be-activated normal address information or to-be-activated redundancy address information for the second memory bank.

In some examples, the memory device further includes a first word line driver and a second word line driver which are located between the redundancy analysis circuit, the second decoding circuit and the first memory bank, and a third word line driver and a fourth word line driver which are located between the redundancy analysis circuit, the third decoding circuit and the second memory bank; the first word line driver is configured to receive the output signal of the decoding circuit, generate a first driving signal; the first driving signal is for driving a normal row in the first memory bank; and/or, the second word line driver is configured to receive the output signal of the decoding circuit, generate a second driving signal; the second driving signal is for driving a redundancy row in the first memory bank; the third word line driver is configured to receive the output signal of the decoding circuit, generate a third driving signal; the third driving signal is for driving a normal row in the second memory bank; and/or, the fourth word line driver is configured to receive the output signal of the decoding circuit, generate a fourth driving signal; the fourth driving signal is for driving a redundancy row in the second memory bank.

In a third aspect, an example of the present application provides a memory system including: one or more memory devices of any one provided by the first aspect; and a memory controller coupled to and controlling the memory device.

In a fourth aspect, an example of the present application provides a method for operating a memory device, wherein the memory device includes a first memory bank and a second memory bank, and a redundancy analysis circuit coupled to both the first memory bank and the second memory bank; the operating method includes: by the redundancy circuit of the redundancy analysis circuit, storing invalid address information for the first memory bank and the second memory bank; outputting an invalid address signal according to an enable signal of the first memory bank or the second memory bank, the invalid address signal including invalid address information for the first memory bank or the second memory bank; by the matching circuit of the redundancy analysis circuit coupled to the redundancy circuit, receiving a to-be-activated address signal and the invalid address signal, and matching the to-be-activated address information in the to-be-activated address signal with the invalid address information in the invalid address signal, outputting a matching address signal.

In some examples, the operating method further includes: by a first decoding circuit in a decoding circuit coupled to the redundancy analysis circuit, receiving the to-be-activated address signal and the matching address signal, and generating a first decoding signal according to the to-be-activated address signal and the matching address signal; the first decoding signal including at least one of to-be-activated normal address information or to-be-activated redundancy address information for the first memory bank/the second memory bank; in response to the enable signal of the first memory bank, by a first register coupled to the first decoding circuit, storing the first decoding signal; in response to the enable signal of the second memory bank, by a second register coupled to the first decoding circuit, storing the first decoding signal.

In some examples, the operating method includes: the first memory bank is activated in response to the second register completing the storing of the first decoding signal; or the second memory bank is activated in response to the first register completing the storing of the first decoding signal.

In some examples, the operating method further includes: by the redundancy analysis circuit, receiving and storing the first signal, and in response to the first register completing the storing of the third signal, receiving and storing the second signal/the first signal at a next time, by the first decoding circuit, generating the fourth signal/the third signal; or by the redundancy analysis circuit, receiving and storing the second signal, in response to the second register completing the storing of the fourth signal, receiving and storing the first signal/the second signal, by the first decoding circuit, generating the third signal/the fourth signal; wherein the to-be-activated address signal includes a first signal or a second signal, and the first signal includes to-be-activated address information for the first memory bank, the second signal includes to-be-activated address information for the second memory bank; the first decoding signal includes a third signal or a fourth signal, the third signal includes at least one of to-be-activated normal address information or to-be-activated redundancy address information for the first memory bank, the fourth signal includes at least one of to-be-activated normal address information or to-be-activated redundancy address information for the second memory bank.

In some examples, the operating method further includes: in response to the enable signal of the first memory bank being in the enable state, by a second decoding circuit in a decoding circuit coupled to the redundancy analysis circuit, receiving the to-be-activated address signal and the matching address signal, and generating a second decoding signal according to the to-be-activated address signal and the matching address signal; the second decoding signal including at least one of to-be-activated normal address information or to-be-activated redundancy address information for the first memory bank; in response to the enable signal of the second memory bank being in the enable state, by a third decoding circuit in a decoding circuit coupled to the redundancy analysis circuit, receiving the to-be-activated address signal and the matching address signal, and generating a third decoding signal according to the to-be-activated address signal and the matching address signal; the third decoding signal including at least one of to-be-activated normal address information or to-be-activated redundancy address information for the second memory bank.

In some examples, the operating method includes: by the row redundancy circuit, storing corresponding invalid row address information for the first memory bank and the second memory bank respectively, and outputting an invalid row address signal, the invalid row address signal including invalid row address information corresponding to one to-be-activated memory bank from the first memory bank and the second memory bank; by the row matching circuit, receiving a to-be-activated row address signal, and matching the to-be-activated row address information in the to-be-activated row address signal with the invalid row address information in the invalid row address signal, and outputting a matching row signal; by the row decoding circuit, receiving the to-be-activated row address signal and the matching row signal, and generating a first row decoding signal/a second row decoding signal/a third row decoding signal according to the to-be-activated row address signal and the matching row signal; the first row decoding signal/the second row decoding signal/the third row decoding signal including at least one of to-be-activated row address information or to-be-activated redundancy row address information for the first memory bank/the second memory bank; wherein the redundancy analysis circuit includes a row redundancy analysis circuit, the row redundancy analysis circuit including a row redundancy circuit and a row matching circuit, the decoding circuit including the row decoding circuit.

In some examples, the operating method includes: in response to the enable state of the first read signal, by the first latch circuit storing the first invalid row address signal outputting the stored first invalid row address signal; or in response to the enable state of the second read signal, by the second latch circuit storing the second invalid row address signal outputting the stored second invalid row address signal; by the comparison circuit, receiving the to-be-activated row address signal and the first invalid row address signal/the second invalid row address signal, generating the matching row signal; wherein the row redundancy circuit includes a first latch circuit and a second latch circuit; the row matching circuit includes a comparison circuit.

In some examples, the operating method includes: in response to the enable state of the first write signal, by the first latch circuit, storing the to-be-stored first invalid row address signal; or, in response to the enable state of second write signal, by the second latch circuit, storing the to-be-stored second invalid row address signal.

In some examples, the operating method further includes: in response to the enable signal of the first memory bank, by the control circuit, generating a first read signal, or, in response to the enable signal of the second memory bank, by the control circuit, generating a second read signal; wherein the memory device includes a control circuit.

In some examples, the operating method further includes: in response to an invalid row occurring in normal rows in the first memory bank, by the control circuit, generating the to-be-stored first invalid row address signal corresponding to the invalid row in the first memory bank and the first write signal, or, in response to an invalid row occurring in normal rows in the second memory bank, by the control circuit, generating the to-be-stored second invalid row address signal corresponding to the invalid row in the second memory bank and the second write signal.

In some examples, the first latch circuit includes a first gating circuit, a first latch, and a second gating circuit; the second latch circuit includes a third gating circuit, a second latch, and a fourth gating circuit; the operating method further includes: by the first gating circuit, receiving the to-be-stored first invalid row address signal and the first write signal, and in response to the enable state of the first write signal, transmitting the to-be-stored first invalid row address signal to the first latch; by the first latch, receiving and storing the to-be-stored first invalid row address signal/outputting the stored first invalid row address signal; by the second gating circuit, receiving the first invalid row address signal stored in the first latch and the first read signal, and in response to the enable state of the first read signal, transmitting the first invalid row address signal stored in the first latch to the comparison circuit; or, by the third gating circuit, receiving the to-be-stored second invalid row address signal and the second write signal, and in response to the enable state of the second write signal, transmitting the to-be-stored second invalid row address signal to the second latch; by the second latch, receiving and storing the to-be-stored second invalid row address signal/outputting the stored second invalid row address signal; by the fourth gating circuit, receiving the second invalid row address signal stored in the second latch and the second read signal, and in response to the enable state of the second read signal, transmitting the second invalid row address signal stored in the second latch to the comparison circuit.

In some examples, the comparison circuit includes a transmission gate and a fifth gating circuit; the operating method further includes: by the transmission gate, receiving the to-be-activated row address signal and the first invalid row address signal/the second invalid row address signal, and generating a first state of the matching row signal in response to an enable state of the first invalid row address signal/the second invalid row address signal; the first state of the matching row signal representing an invalid row address matching the first invalid row address/the second invalid row address being included in the to-be-activated row address; by the fifth gating circuit, receiving a reverse signal of the to-be-activated row address signal and a reverse signal of the first invalid row address signal/the second invalid row address signal, in response to an enable state of the reverse signal of the first invalid row address signal/the second invalid row address signal, the generated matching row signal is in a second state; the second state of the matching row signal representing an invalid row address matching the first invalid row address/the second invalid row address not being included in the to-be-activated row address.

In some examples, the memory device further includes a first word line driver, a second word line driver, a third word line driver, and a fourth word line driver; the operating method further includes: at least one of: by the first word line driver, receiving the output signal of the decoding circuit, generating a first driving signal; the first driving signal being for driving a normal row in the first memory bank; or, by the second word line driver, receiving the output signal of the decoding circuit, generating a second driving signal; the second driving signal being for driving a redundancy row in the first memory bank; at least one of: by the third word line driver, receiving the output signal of the decoding circuit, generating a third driving signal; the third driving signal being for driving a normal row in the second memory bank; or, by the fourth word line driver, receiving the output signal of the decoding circuit, generating a fourth driving signal; the fourth driving signal being for driving a redundancy row in the second memory bank.

In the examples of the present application, on the premise of ensuring that the redundancy analysis function is normal, the first memory bank and the second memory bank of the memory device share a redundancy analysis circuit; and due to circuit multiplexing, area may be saved and the size of the memory device may be improved, thereby increasing the integration level of the memory device; and reducing the overall power consumption and static leakage of the memory device due to reducing a portion of the circuit.

DETAILED DESCRIPTION

Figure 1:
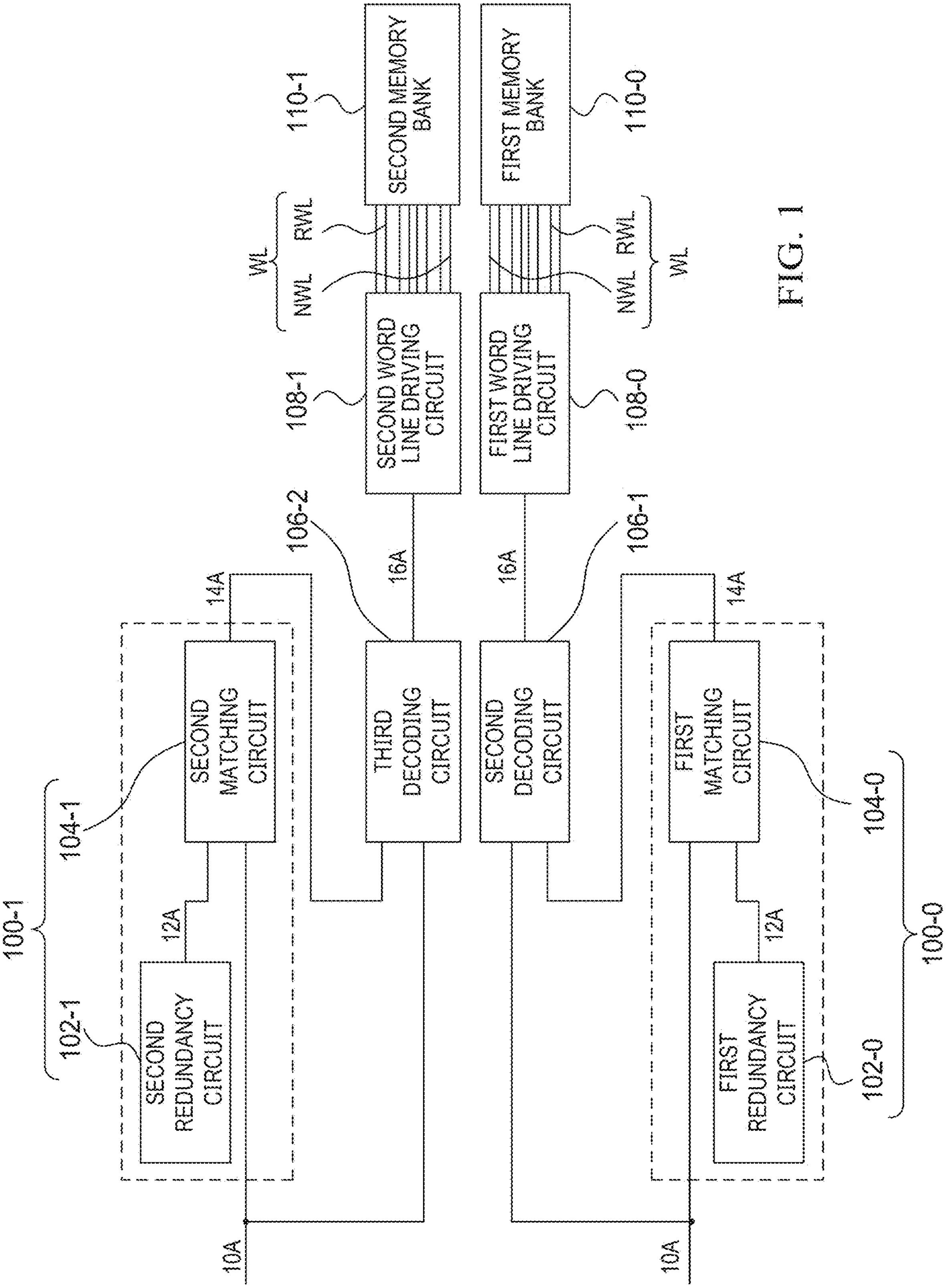
FIG. 1 is a schematic diagram 1 of a redundancy analysis circuit of a memory device provided by an example of the present application.

The technical solutions in implementations of the present application will be clearly and completely described below in conjunction with the implementations and accompanying drawings, apparently, the described implementations are only some, not all of implementations of the present application. All other implementations obtained by those skilled in the art based on the implementations in the present application without making creative efforts belong to the claimed scope of the present application.

In the following description, numerous specific details are given in order to provide a more thorough understanding of the present application. However, it will be apparent to one skilled in the art that the present application may be practiced without one or more of these details. In other examples, in order to avoid confusion with the present application, some technical features known in the art are not described; that is, not all features of the actual example are described here, and well-known functions and structures are not described in detail.

In the accompanying drawings, size of a layer, a region, an element and their relative sizes may be exaggerated for clarity. Like reference numerals refer to like elements throughout.

It will be understood that when an element or layer is referred to as being "on," "adjacent to," "connected to" or "coupled to" another element or layer, it may be directly on, adjacent to, connected to or coupled to another element or layer, or intervening elements or layers may be present. In contrast, when an element is referred to as being "directly on," "directly adjacent to," "directly connected to" or "directly coupled to" another element or layer, there is no intervening elements or layers present. It will be understood that, although the terms first, second, third etc., may be used to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed below may be termed as a second element, component, region, layer or part without departing from teachings of the present application. Whereas a second element, component, region, layer or part is discussed, it does not indicate that a first element, component, region, layer or part necessarily presents in the present application.

The spatially relative terms such as "beneath", "below", "lower", "under", "above", "on", etc., may be used herein for ease of description to describe one element or feature's relationship to another element(s) or feature(s) as illustrated in the figures. It will be understood that the spatially relative terms are intended to encompass different orientations of the device in use or operations in addition to the orientation depicted in the figures. For example, if the device in the appended drawings is turned over, an element or a feature described as "below" or "beneath" or "under" another element or feature would then be oriented "above" the another element or feature. Thus, illustrated terms "below" and "under" may encompass both directions of up and down. A device may be otherwise oriented (rotated 90 degrees or at other orientations) and the spatially descriptive terms used herein should be interpreted accordingly.

A term used herein is for the purpose of describing a particular example only and is not to be considered as limitation of the present application. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, steps, operations, elements and/or parts, but do not exclude the presence or addition of one or more other features, integers, steps, operations, elements, parts and/or groups. As used herein, the term "and/or" includes any and all combinations of the associated listed items.

In order to thoroughly understand the present application, detailed operations and detailed structures will be provided in the following description, so as to explain the technical solution of the present application. Preferred examples of the present application are described in detail as follows, however, the present application may have other examples other than these detailed descriptions.

A memory array of a memory device, e.g., Dynamic Random Access Memory (DRAM) includes normal memory arrays and redundant memory arrays, and DRAM is equipped with redundancy related circuit systems that can use redundant cells in redundant memory cells to replace failure cells in normal memory cells to improve yield.

Referring to FIG. 1, the signal path that the to-be-activated address signal 10*a* each time input into the memory device (e.g., a DRAM) passes through: taking the to-be-activated address signal 10*a* sent to the first memory bank 110-0 as an example, the to-be-activated address signal 10*a* is input, the first redundancy circuit 102-0 of the first redundancy analysis circuit 100-0 of the first memory bank 110-0 outputs the invalid address signal 12*a*, the first matching circuit 104-0 of the first redundancy analysis circuit 100-0 receives the to-be-activated address signal 10*a* and the invalid address signal 12*a*, and outputs a matching address signal 14*a*; the second decoding circuit 106-1 of the first memory bank 110-0 receives the to-be-activated address signal 10*a* and the matching address signal 14*a*, and outputs the first decoding signal 16*a*; the first word line driving circuit 108-0 of the first memory bank 110-0 enables at least one of the normal word line nwl or the redundancy word line rwl corresponding to the to-be-activated address signal 10*a* according to the received first decoding signal 16*a* to drive at least one of a normal cell or redundant cell in the first memory bank 110-0. Here, the first redundancy circuit 102-0 of the first memory bank 110-0 is to store the address information (invalid address information) of the failure cell of the first memory bank 110-0; the invalid address signal 12*a* includes the invalid address information for the first memory bank 110-0.

Here, each memory bank includes an independent redundancy circuit and a matching circuit. Wherein, the first redundancy circuit 102-0 of the first redundancy analysis circuit 100-0 of the first memory bank 110-0 outputs the invalid address signal 12*a* including the invalid address information for the failure cell in the first memory bank 110-0, the second redundancy circuit 102-1 of the second redundancy analysis circuit 100-1 of the second memory bank 110-1 outputs the invalid address signal 12*a* including the invalid address information for the failure cell in the second memory bank 110-1.

The signal path passed by the to-be-activated address signal 10*a* sent to the second memory bank 110-1 may be understood with reference to the signal path passed by the to-be-activated address signal 10*a* sent to the first memory bank 110-0. Each of circuits passed through by the signal path corresponding to the second memory bank 110-1, e.g., the second redundancy circuit 102-1 of the second redundancy analysis circuit 100-1, the second matching circuit 104-1 of the second redundancy analysis circuit 100-1, the third decoding circuit 106-2 and the second word line driving circuit 108-1 may be understood respectively referring to the first redundancy circuit 102-0 of the first redundancy analysis circuit 100-0, the first matching circuit 104-0 of the first redundancy analysis circuit 100-0, the second decoding circuit 106-1 and the first word line driving circuit 108-0.

Figure 2:
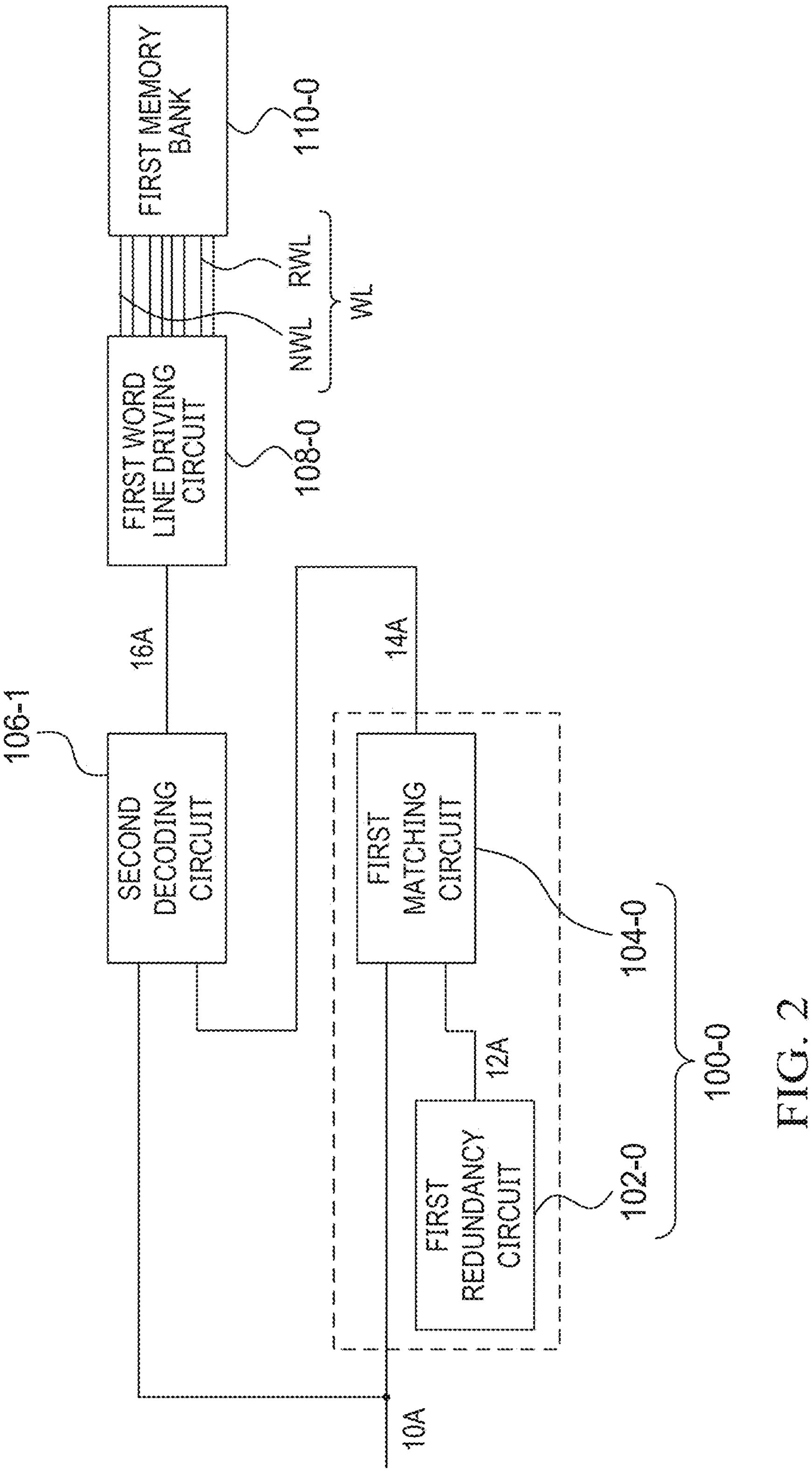
FIG. 2 is a schematic diagram of part of the circuit of FIG. 1.

Referring to FIG. 2, the redundancy related circuit system equipped for DRAM and the address signal path passed through by the invalid address signal 12*a*: taking the to-be-activated address signal 10*a* sent to the first memory bank 110-0, the first redundancy circuit 102-0 storing the invalid address information for the failure cell in the first memory bank 110-0 and outputting the invalid address signal 12*a* as an example, the first matching circuit 104-0 of the first redundancy analysis circuit 100-0 of the first memory bank 110-0 receives the to-be-activated address signal 10*a* and the invalid address signal 12*a*, and outputs a matching address signal 14*a*; the second decoding circuit 106-1 of the first memory bank 110-0 receives the matching address signal 14*a*, and outputs the first decoding signal 16*a*; the first word line driving circuit 108-0 of the first memory bank 110-0 enables the redundancy word line rwl corresponding to the to-be-activated address signal 10*a* according to the received first decoding signal 16*a*, to drive the redundant cell in the first memory bank 110-0.

It should be noted that components/circuits/devices/signals marked with the same numbers in the memory devices in various examples of the present application shall be understood as identical or similar components/circuits/devices/signals, e.g., the first memory bank 110-0 and the second memory bank 110-1, the first word line driving circuit 108-0 and the second word line driving circuit 108-1 in each schematic diagram.

It should be noted that if the input to-be-activated address contains an invalid address (or failure address), the invalid address needs to be replaced with a redundancy address, and when an invalid cell (or referred to as a failure cell) is accessed, it will automatically be switched to access the redundant cell corresponding to the failure cell, the redundant cell is for replacing the failure cell.

Figure 3:
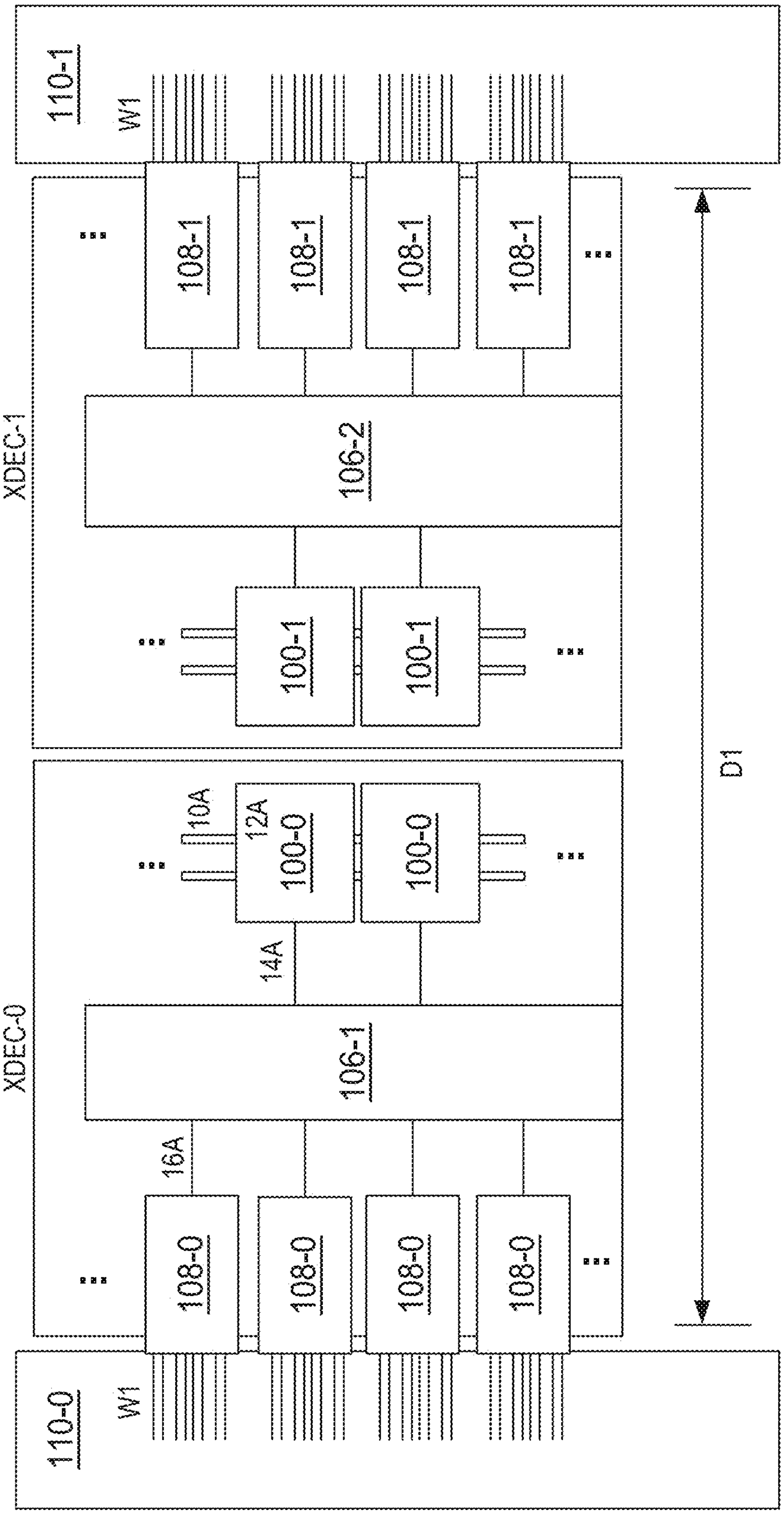
FIG. 3 is a schematic diagram 1 of the plane layout of a memory device provided by an example of the present application.

FIG. 3 is a schematic diagram of the X-Y plane layout of a memory device provided by an example of the present application; Here and below, for the convenience of description, the first direction and the second direction in each example of the present application are represented as two orthogonal directions parallel to the top surface of the memory device; the third direction is the thickness direction of the memory device, which is perpendicular to the top surface of the memory device. The first direction may be represented as the X direction in the drawings; the second direction may be represented as the Y direction in the drawings; and the third direction may be represented as the Z direction in the drawings.

Referring to FIG. 3, the memory device includes a first memory bank 110-0, a first decoding circuit xdec-0 coupled to the first memory bank 110-0, a second memory bank 110-1, and a second decoding circuit xdec-1 coupled to the second memory bank 110-1; the first decoding circuit xdec-0 and the second decoding circuit xdec-1 are both located between the first memory bank 110-0 and the second memory bank 110-1; wherein the first decoding circuit xdec-0 includes a first redundancy analysis circuit 100-0, a second decoding circuit 106-1 and a first word line driving circuit 108-0, the second decoding circuit xdec-1 includes a second redundancy analysis circuit 100-1, a third decoding circuit 106-2 and a second word line driving circuit 108-1.

The connection relationship between the first redundancy analysis circuit 100-0, the second decoding circuit 106-1, the first word line driving circuit 108-0 and the first memory bank 110-0 and the signal flow path may be understood referring to the connection relationship between the first redundancy analysis circuit 100-0 of the first memory bank 110-0, the second decoding circuit 106-1, the first word line driving circuit 108-0 and the first memory bank 110-0 and signal flow path in FIG. 1. Accordingly, the connection relationship between the second memory bank 110-1 and the second decoding circuit xdec-1 and the signal flow path may be understood referring to the connection relationship between the first memory bank 110-0 and the first decoding circuit xdec-0 and the signal flow path.

It is required to compare the to-be-activated address information each time input into the memory device with the invalid address information stored in the redundancy analysis circuit to determine whether the input to-be-activated address each time is an invalid address, and based on this, to determine whether redundancy replacement is required, that is, replace the invalid address with a redundancy address, and when a failure cell is accessed based on the to-be-activated address signal, it will automatically switched to access the redundant cell corresponding to the failure cell, the redundant cell is for replacing the failure cell. However, the storage and comparison circuit in the redundancy analysis circuit will occupy a considerable part of the overall area of the decoding circuit, e.g., the area of the first redundancy analysis circuit 100-0 occupies approximately ¼ of the area of the first decoding circuit xdec-0.

Figure 4:
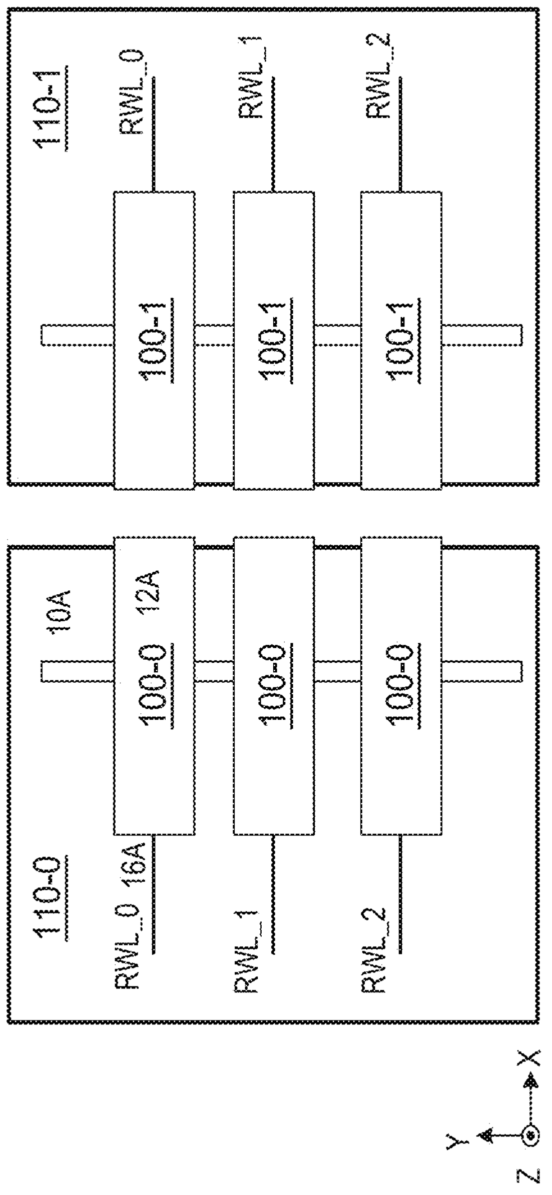
FIG. 4 is a schematic diagram 2 of the plane layout of a memory device provided by an example of the present application.

Referring to FIGS. 3 and 4, the first memory bank 110-0 and the second memory bank 110-1 include respective independent decoding circuits located between the first memory bank 110-0 and the second memory bank 110-1, the decoding circuit (e.g., the first redundancy analysis circuit 100-0 and the second redundancy analysis circuit 100-1) occupies a considerable part of the area, resulting in a large first distance D1 between the first memory bank 110-0 and the second memory bank 110-1, thereby hindering improvement in the size of the memory device.

Figure 5:
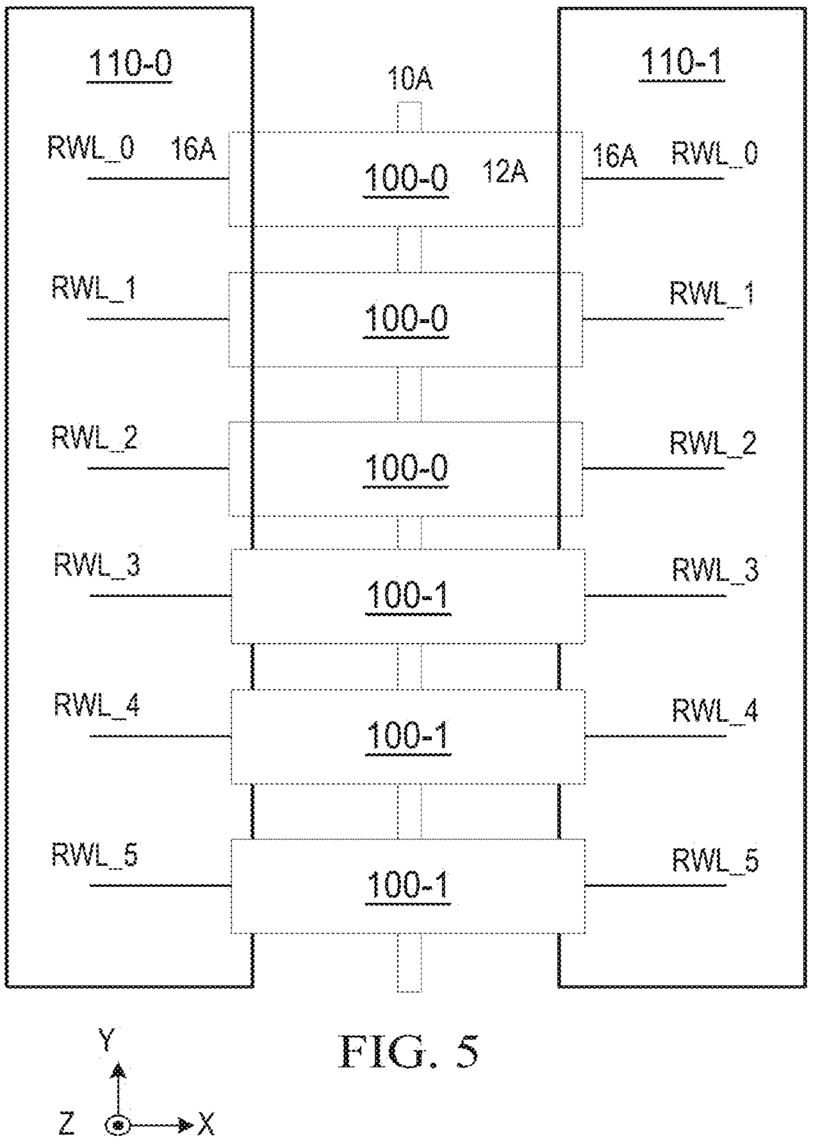
FIG. 5 is a schematic diagram 3 of the plane layout of a memory device provided by an example of the present application.

Referring to FIG. 5, in some examples, the first memory bank 110-0 and the second memory bank 110-1 may multiplex a decoding circuit (e.g., multiplex the first redundancy analysis circuit 100-0 and the second redundancy analysis circuit 100-1). Thus, the redundancy circuit area may be reduced to save memory device area and reduce static leakage; however, the number of redundancy word lines rwl in each memory bank (one of the first memory bank 110-0 and the second memory bank 110-1) may need to be increased, and the area of the memory array of the memory bank may be increased. For example, compared with the number of redundancy word lines rwl of the first memory bank 110-0 in FIG. 4 (including redundancy word lines rwl_0, rwl_1, rwl_2), the number of redundancy word lines rwl (including redundancy word lines rwl_0, rwl_1, rwl_2, rwl_3, rwl_4, rwl_5) of the first memory bank 110-0 in FIG. 5 has been increased.

Figure 6:
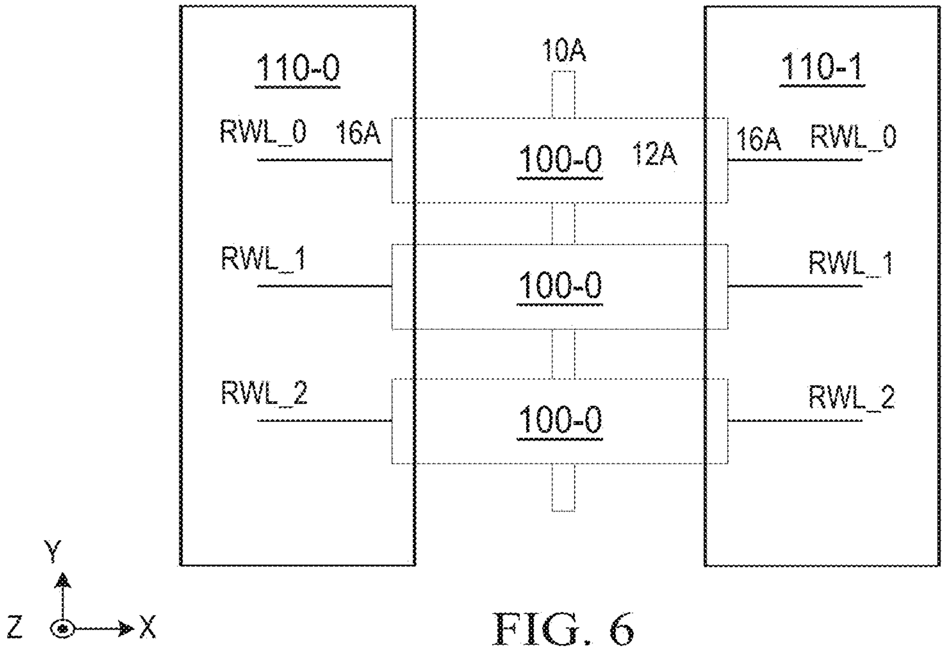
FIG. 6 is a schematic diagram 4 of the plane layout of a memory device provided by an example of the present application.

Referring to FIG. 6, in some examples, the first memory bank 110-0 and the second memory bank 110-1 may share a decoding circuit (e.g., share the first redundancy analysis circuit 100-0). Thus, the redundancy circuit area may be reduced to save memory device area and reduce static leakage; however, when the first redundancy analysis circuit 100-0 is to replace the word line in the first memory bank 110-0 with a redundancy word line, the word line wl in the second memory bank 110-1 will also be replaced with a redundancy word line synchronously, the first redundancy analysis circuit 100-0 limits the flexibility of redundancy replacement of the first memory bank 110-0 and the second memory bank 110-1 respectively. For example, the first memory bank 110-0 and the second memory bank 110-1 share the first redundancy analysis circuit 100-0, and if the first redundancy analysis circuit 100-0 is to replace a word line wl<64> in the first memory bank 110-0 with a redundancy word line rwl<0>, the word line wl<64> in the second memory bank 110-1 will also be replaced by the redundancy word line rwl<0>.

Therefore, it is required to perform a circuit multiplexing without affecting the independent replacement of a failure cell in each memory bank to save area, thereby improving the size of the memory device and increasing the integration of the memory device.

In view of this, examples of the present application provide a memory device an operating method thereof and a memory system.

Figure 7:
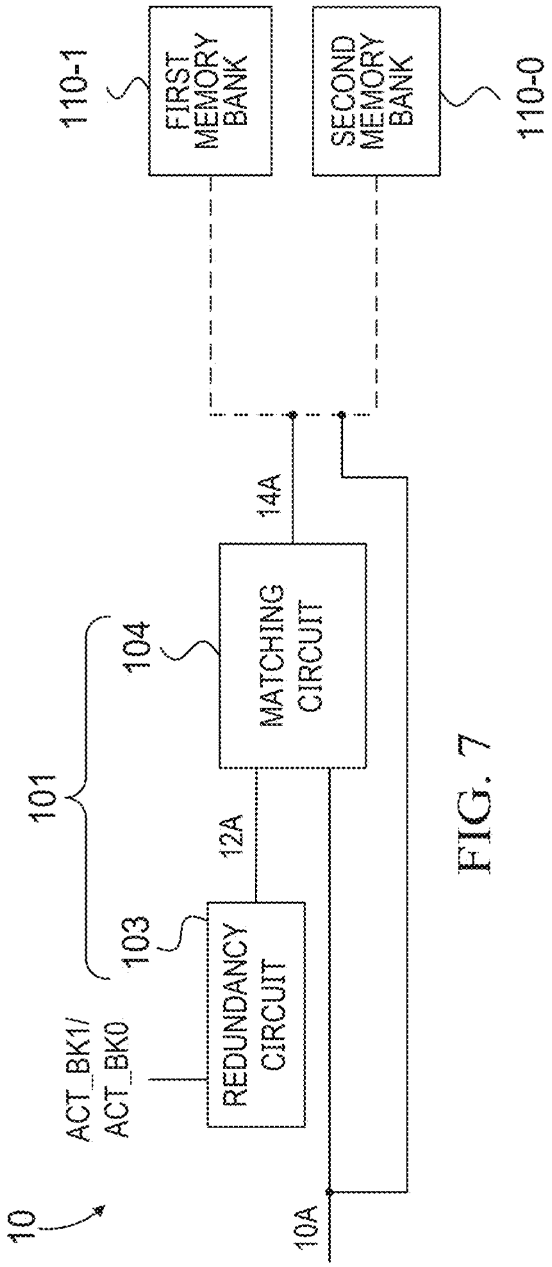
FIG. 7 is a schematic diagram 1 of a redundancy circuit and matching circuit of another memory device provided by an example of the present application.

In a first aspect, an example of the present application provides a memory device, referring to FIG. 7, the memory device 10 includes: a first memory bank 110-0 and a second memory bank 110-1; and a redundancy analysis circuit 101 coupled to both the first memory bank 110-0 and the second memory bank 110-1; wherein the redundancy analysis circuit 101 includes: a redundancy circuit 103 which stores invalid address information for the first memory bank 110-0 and the second memory bank 110-1, and is configured to output an invalid address signal 12*a* according to an enable signal ACT_BK0/ACT_BK1 of the first memory bank 110-0 or the second memory bank 110-1, wherein the invalid address signal 12*a* includes invalid address information for the first memory bank 110-0 or the second memory bank 110-1; a matching circuit 104 coupled to the redundancy circuit 103 and configured to receive a to-be-activated address signal 10*a* and the invalid address signal 12*a*, match the to-be-activated address information in the to-be-activated address signal 10*a* with the invalid address information in the invalid address signal 12*a*, and output a matching address signal 14*a*.

The memory device 10, e.g., a DRAM, may include a plurality of memory banks (including a first memory bank 110-0 and a second memory bank 110-1), e.g., 8 memory banks, and the number of memory banks may also be less than 8 or more than 8. Each memory bank may include multiple memory arrays, e.g., 4 memory arrays, and the number of memory arrays may be less than 4 or more than 4. For example, a DRAM in which each memory bank includes 4 memory arrays may be represented as X4 DRAM.

A memory array may include a normal memory array and a redundant memory array. A portion of the memory array may be a normal memory array, and the remaining memory array may be a redundant memory array. A redundant cell in a redundant memory array may be used to replace a failure cell in a normal memory array. A normal cell in a normal memory array may be represented as an accessible memory cell. The memory device may be configured to, in the case that redundancy enable is active, it is automatically switched to access a redundant cell in a redundant memory array used to replace the failure cell when accessing a failure cell in a normal memory array based on an to-be-activated address signal. That is to say, access to the failure cell is prohibited when redundancy enable is active.

The redundancy analysis circuit 101 includes a Content Addressable Memory (CAM).

The redundancy circuit 103 includes an internal register for storing address information for the failure cell; e.g., storing invalid address information for the failure cell in the first memory bank 110-0 and the second memory bank 110-1.

The matching circuit 104 includes a comparison circuit for comparing the input to-be-activated address signal 10*a* with the invalid address signal 12*a* for the first memory bank 110-0 or the second memory bank 110-1 stored in the redundancy analysis circuit, and outputs a matching address signal 14*a*. Wherein the matching address signal 14*a* being in the first state indicates that an invalid address is included in the to-be-activated input address, it is required to replace the invalid addresses with a redundancy address, and in the case that redundancy enable is active, when accessing a failure cell based on the to-be-activated address signal, it will be automatically switched to access the redundant cell corresponding to the failure cell, the redundant cell is for replacing the failure cell, that is to say, access to a failure cell is prohibited when redundancy enable is active. The matching address signal 14*a* being in the second state indicates that an invalid address is not included in the to-be-activated input address and a redundancy replacement is not required.

Here, the invalid address signal 12*a* includes invalid address information for the failure cell in the first memory bank 110-0 or the second memory bank 110-1.

Compared with each memory including an independent redundancy circuit and a matching circuit (refer to FIG. 1), in the example of the present application, refer to FIG. 7, the first memory bank 110-0 and the second memory bank 110-1 may share the redundancy circuit 103, the redundancy circuit 103 is configured to store the invalid address information for the first memory bank 110-0 and the second memory bank 110-1; the first memory bank 110-0 and the second memory bank 110-1 may share the matching circuit 104, and the matching circuit 104 is configured to compare the input to-be-activated address signal with the invalid address information for the first memory bank 110-0 or the second memory bank 110-1 stored in the redundancy analysis circuit, and outputs a matching address signal.

In some examples, the redundancy circuit 103 outputs the invalid address signal 12*a* according to the enable signal ACT_BK0 of the first memory bank 110-0, and the invalid address signal 12*a* contains the invalid address information for the first memory bank 110-0; the matching circuit 104 receives a to-be-activated address signal 10*a* and the invalid address signal 12*a*, and matches the to-be-activated address information in the to-be-activated address signal 10*a* with the invalid address information in the invalid address signal 12*a*, and outputs a matching address signal 14*a*, The matching address signal 14*a* represents whether the input to-be-activated address signal 10*a* contains an invalid address and is to determine whether the invalid address needs to be replaced with a redundancy address. Wherein the matching address signal 14*a* and the to-be-activated address signal 10*a*, after being decoded by the decoding circuit (refer to FIG. 8), may be for driving at least one of a normal cell or a redundant cell in the first memory bank 110-0.

In the example of the present application, the first memory bank and the second memory bank of the memory device share a redundancy analysis circuit, e.g., the first memory bank and the second memory bank share a redundancy analysis circuit; and due to the circuit multiplexing, area may be saved and the size of the memory device may be improved, thereby increasing the integration level of the memory device; and reducing a portion of the circuit will reduce the overall power consumption and static leakage of the memory device.

Figure 8:
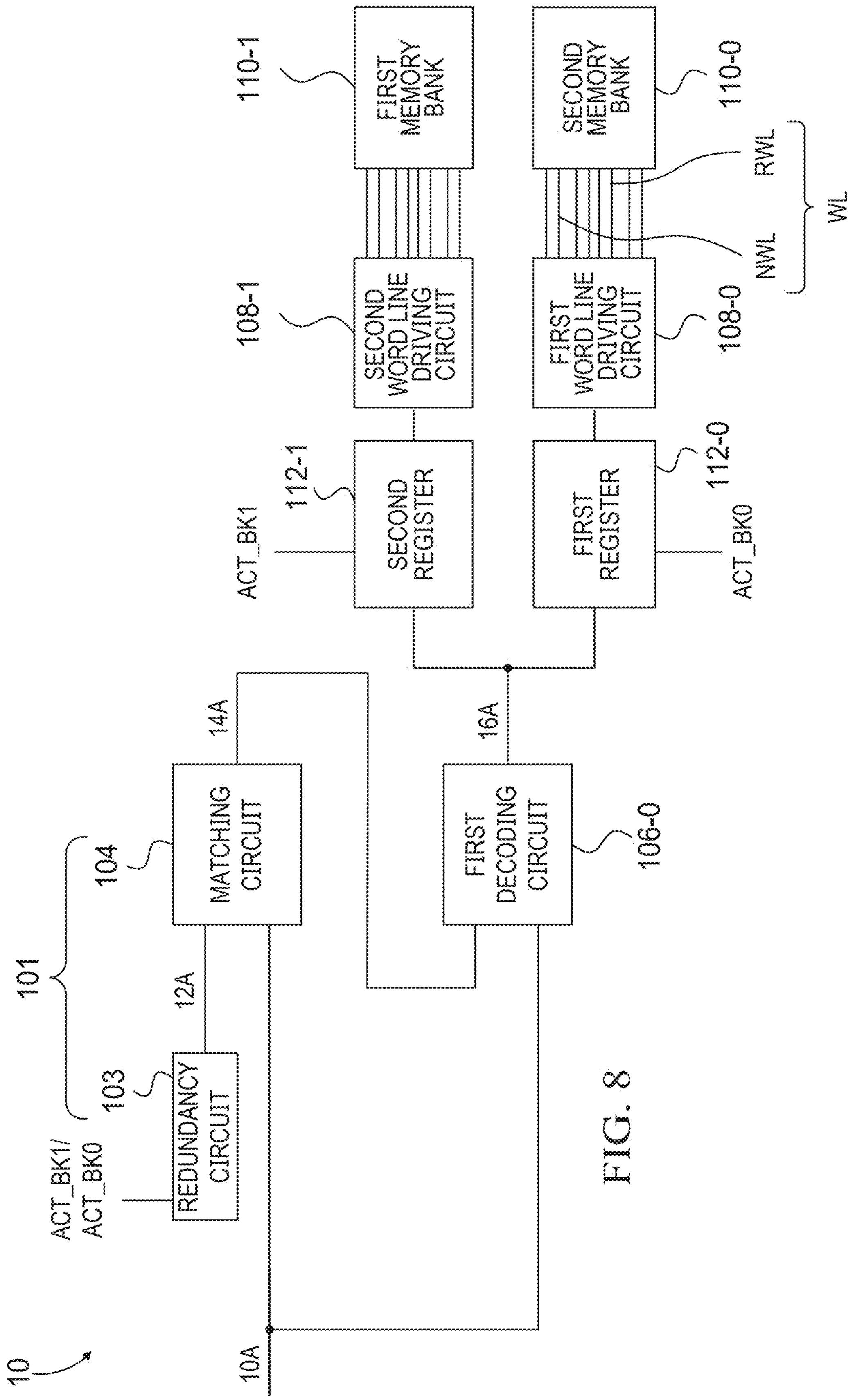
FIG. 8 is a schematic diagram 2 of a redundancy circuit and matching circuit of another memory device provided by an example of the present application.

Referring to FIG. 8, in some examples, the memory device 10 further includes a decoding circuit, a first register 112-0, and a second register 112-1; the decoding circuit includes a first decoding circuit 106-0; wherein the first decoding circuit 106-0 is coupled to the redundancy analysis circuit 101 and is configured to receive the to-be-activated address signal 10*a* and the matching address signal 14*a*, and generate a first decoding signal 16*a* according to the to-be-activated address signal 10*a* and the matching address signal 14*a*; the first decoding signal 16*a* including at least one of to-be-activated normal address information, or to-be-activated redundancy address information for the first memory bank 110-0/the second memory bank 110-1; the first register 112-0 is coupled to the first decoding circuit 106-0, and is configured to store the first decoding signal 16*a* in response to the enable signal ACT_BK0 of the first memory bank 110-0 being in an enable state; the second register 112-1 is coupled to the first decoding circuit 106-0, and is configured to store the first decoding signal 16*a* in response to the enable signal ACT_BK1 of the second memory bank 110-1 being in an enable state.

The first decoding circuit 106-0 includes a row decoder for connecting to the memory array of the memory device through a word line (including at least one of a normal word line nwl or a redundancy word line rwl); the row decoder may select one of the word lines based on the address.

In some examples, the redundancy circuit 103 outputs the invalid address signal 12*a* according to the enable signal ACT_BK0 of the first memory bank 110-0, and the invalid address signal 12*a* contains the invalid address information for the first memory bank 110-0; the matching circuit 104 receives a to-be-activated address signal 10*a* and the invalid address signal 12*a*, and matches the to-be-activated address information in the to-be-activated address signal 10*a* with the invalid address information in the invalid address signal 12*a*, and outputs a matching address signal 14*a*; the first decoding circuit 106-0 receives the to-be-activated address signal 10$a$ and the matching address signal 14$a$, and generates the first decoding signal 16$a$ according to the to-be-activated address signal 10$a$ and the matching address signal 14$a$; the first register 112-0 stores the first decoding signal 16$a$ in response to the enable signal ACT_BK0 of the first memory bank 110-0 being in an enable state; The first decoding signal 16$a$ is for driving at least one of a normal cell or a redundant cell in the first memory bank 110-0.

In the example of the present application, the redundancy analysis circuit and the decoding circuit may be used by two memory banks (the first memory bank and the second memory bank) jointly, and since the two memory banks share a redundancy analysis circuit and a decoding circuit, the circuit size may be reduced, thereby saving area. When one of the two memory banks (e.g., the first memory bank) is activated, the corresponding first register will store the first decoding signal output from the shared decoding circuit, and then select at least one of a specific normal word line or a specific redundancy word line in the first memory bank according to the first decoding signal to drive at least one of the corresponding normal cell or the corresponding redundant cell; the second register corresponding to another inactivated memory bank (e.g., the second memory bank) will not latch the first decoding signal output by the decoding circuit to avoid or reduce limitation of the flexibility of redundancy replacement for the first memory bank and the second memory bank by the first redundancy analysis circuit, thereby maintaining the flexibility of the redundancy analysis circuit for redundancy replacement.

Referring to FIG. 8, in some examples, the first memory bank 110-0 is configured to be activated in response to the second register 112-1 completing the storing of the first decoding signal 16$a$; or the second memory bank 110-1 is configured to be activated in response to the first register 112-0 completing the storing of the first decoding signal 16$a$.

In the example of the present application, when an activated memory bank (e.g., the first memory bank) uses the redundancy analysis circuit and the decoding circuit, another memory bank (e.g., the second memory bank) may use the redundancy analysis circuit and the decoding circuit after causing the first decoding signal output by the decoding circuit to be latched by a register (e.g., the first register). In the case that reducing a portion of the original circuit does not bring additional physical costs, the flexibility of the redundancy analysis circuit for redundancy replacement may be maintained.

Referring to FIG. 8, in some examples, the to-be-activated address signal 10$a$ includes a first signal or a second signal, and the first signal includes to-be-activated address information for the first memory bank 110-0, the second signal includes to-be-activated address information for the second memory bank 110-1; the first decoding signal 16$a$ includes a third signal or a fourth signal, the third signal includes at least one of to-be-activated normal address information or to-be-activated redundancy address information for the first memory bank 110-1, the fourth signal includes at least one of to-be-activated normal address information or to-be-activated redundancy address information for the second memory bank 110-1; the redundancy analysis circuit 101 is configured to receive and store the first signal, and in response to the first register completing the storing of the third signal, receive and store the second signal/the first signal at a next time, the first decoding circuit 106-0 is configured to generate the fourth signal/the third signal; or the redundancy analysis circuit 101 is configured to receive and store the second signal, and in response to the second register 112-1 completing the storing of the third signal, receive and store the first signal/the second signal, the first decoding circuit 106-0 is configured to generate the third signal/the fourth signal.

In some examples, the redundancy analysis circuit 101 receives and stores the first signal, and the first decoding circuit 106-0 generates the third signal; in response to the first register 112-0 completing the storing of the third signal, the at a next time the redundancy analysis circuit 101 receives and stores the second signal, the first decoding circuit 106-0 generates a fourth signal, alternatively, at a next time the redundancy analysis circuit 101 still receives and stores the first signal, the first decoding circuit 106-0 generates the third signal.

In the example of the present application, once the first decoding signal output by the decoding circuit is latched by any register, e.g., latched by the first register, the redundancy analysis circuit and the decoding circuit may then be released for the decoding operation of another activation command, e.g., for the activated second memory bank. In the case that reducing a portion of the original circuit does not bring additional physical costs, the flexibility of the redundancy analysis circuit for redundancy replacement may be maintained.

Figure 9:
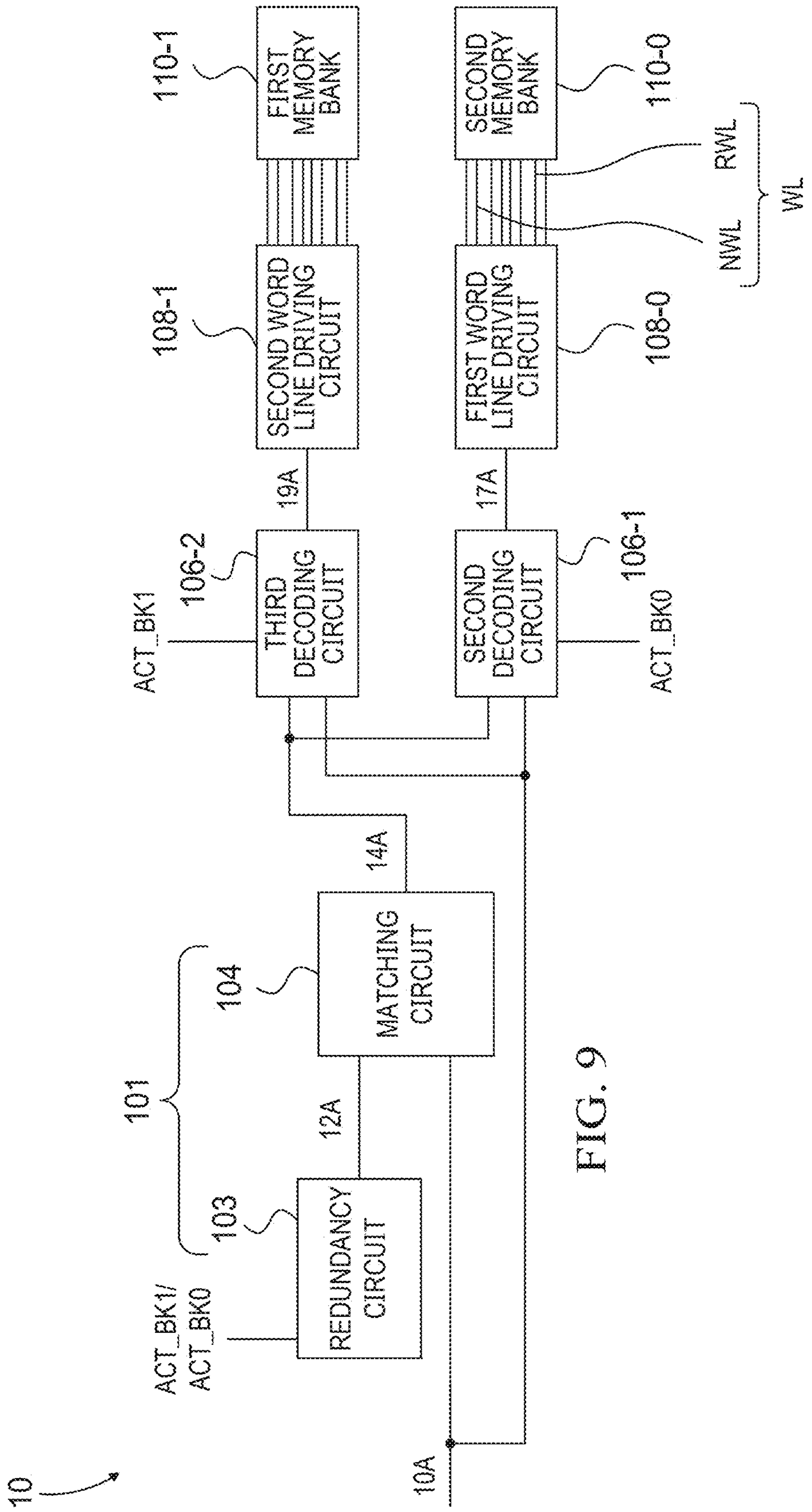
FIG. 9 is a schematic diagram 3 of a redundancy circuit and matching circuit of another memory device provided by an example of the present application.

Referring to FIG. 9, in some examples, the memory device 10 further includes a decoding circuit; the decoding circuit includes a second decoding circuit 106-1 and a third decoding circuit 106-2; wherein the second decoding circuit 106-1 is coupled to the redundancy analysis circuit 101 and is configured to, in response to the enable signal ACT_BK0 of the first memory bank 110-0 being in the enable state, receive the to-be-activated address signal 10$a$ and the matching address signal 14$a$, and generate a second decoding signal 17$a$ according to the to-be-activated address signal 10$a$ and the matching address signal 14$a$; the second decoding signal 17$a$ including at least one of to-be-activated normal address information, or to-be-activated redundancy address information for the first memory bank 110-0; the third decoding circuit 106-2 is coupled to the redundancy analysis circuit 101 and is configured to, in response to the enable signal ACT_BK1 of the second memory bank 110-1 being in the enable state, receive the to-be-activated address signal 10$a$ and the matching address signal 14$a$, and generate a third decoding signal 19$a$ according to the to-be-activated address signal 10$a$ and the matching address signal 14$a$; the third decoding signal 19$a$ including at least one of to-be-activated normal address information, or to-be-activated redundancy address information for the second memory bank 110-1.

The second decoding circuit 106-1 includes a row decoder for connecting to the first memory bank 110-0 through a word line (including at least one of a normal word line nwl or a redundancy word line rwl); the second decoding circuit 106-1 may select one of the word lines wl based on the address. The third decoding circuit 106-2 includes a row decoder for connecting to the second memory bank 110-1 through a word line (including at least one of a normal word line nwl or a redundancy word line rwl); the third decoding circuit 106-2 may select one of the word lines wl based on the address.

In some examples, the redundancy circuit 103 outputs the invalid address signal 12$a$ according to the enable signal ACT_BK0 of the first memory bank 110-0, and the invalid address signal 12$a$ contains the invalid address information for the first memory bank 110-0; the matching circuit 104 receives a to-be-activated address signal 10$a$ and the invalid address signal 12$a$, and matches the to-be-activated address information in the to-be-activated address signal 10$a$ with the invalid address information in the invalid address signal 12*a*, and outputs a matching address signal 14*a*; the second decoding circuit 106-1, according to the enable signal ACT_BK0 of the first memory bank 110-0 being in the enable state, receives the to-be-activated address signal 10*a* and the matching address signal 14*a*, and generates the second decoding signal 17*a* according to the to-be-activated address signal 10*a* and the matching address signal 14*a*; the second decoding signal 17*a* is for driving at least one of a normal cell or a redundant cell in the first memory bank 110-0.

In the example of the present application, the redundancy analysis circuit may be used by two memory banks (the first memory bank and the second memory bank) jointly, since the two memory banks share a redundancy analysis circuit, the circuit size may be reduced, thereby saving area. The memory bank (e.g., the first memory bank) is activated, and the corresponding second decoding circuit generates a second decoding signal according to the to-be-activated address signal and the matching address signal, then selects at least one of a specific normal word line or redundancy word line in the first memory bank according to the second decoding signal, to drive at least one of the corresponding normal cell or redundant cell; the third decoding circuit corresponding to another inactivated memory bank (e.g., the second memory bank) does not receive the to-be-activated address signal and the matching address signal, and not generate a third decoding signal for driving at least one of the a normal cell or a redundant cell in the second memory bank, thus may maintain the flexibility of the redundancy analysis circuit for redundancy replacement.

Figure 10:
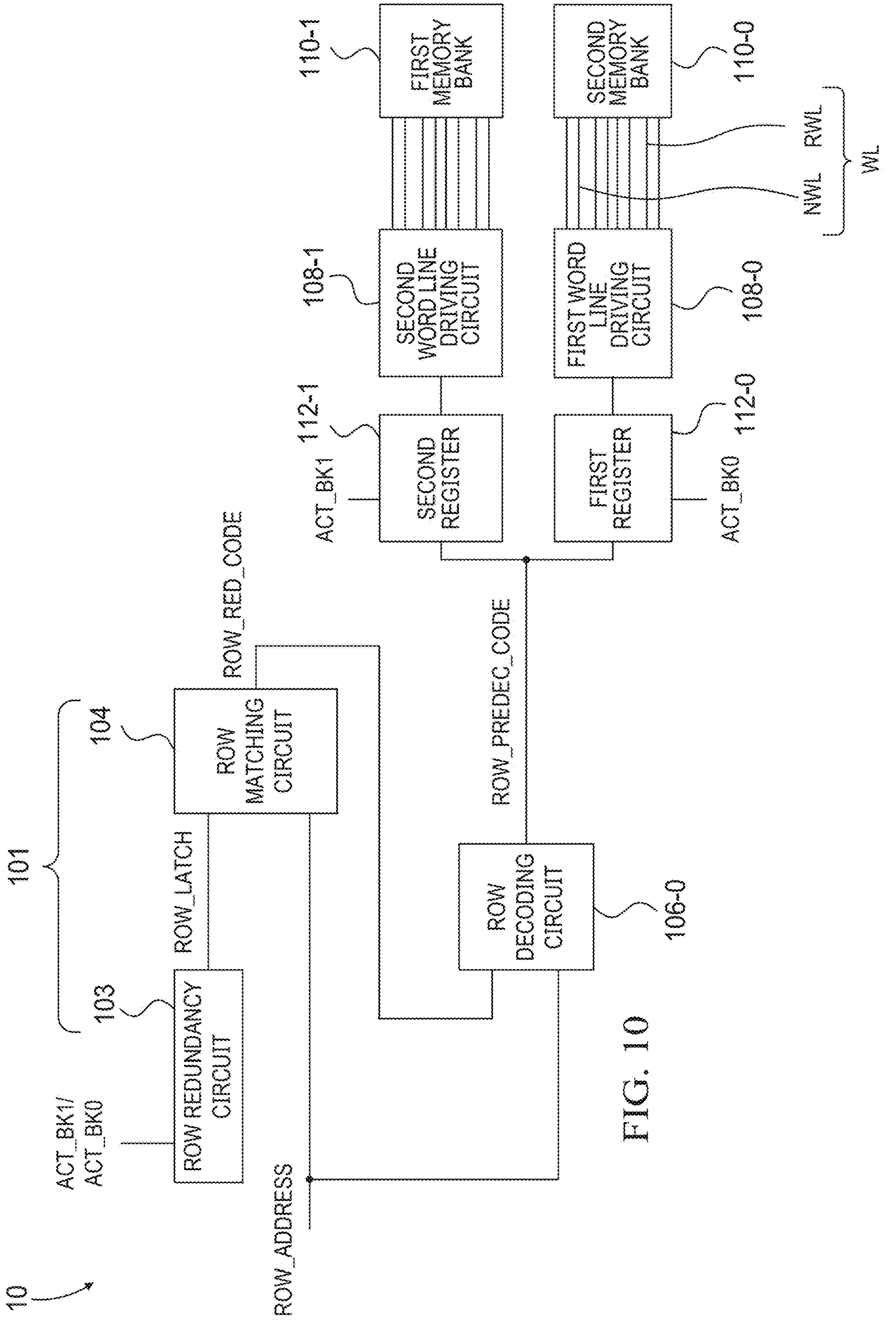
FIG. 10 is a schematic diagram 4 of a redundancy circuit and matching circuit of another memory device provided by an example of the present application.
Figure 11:
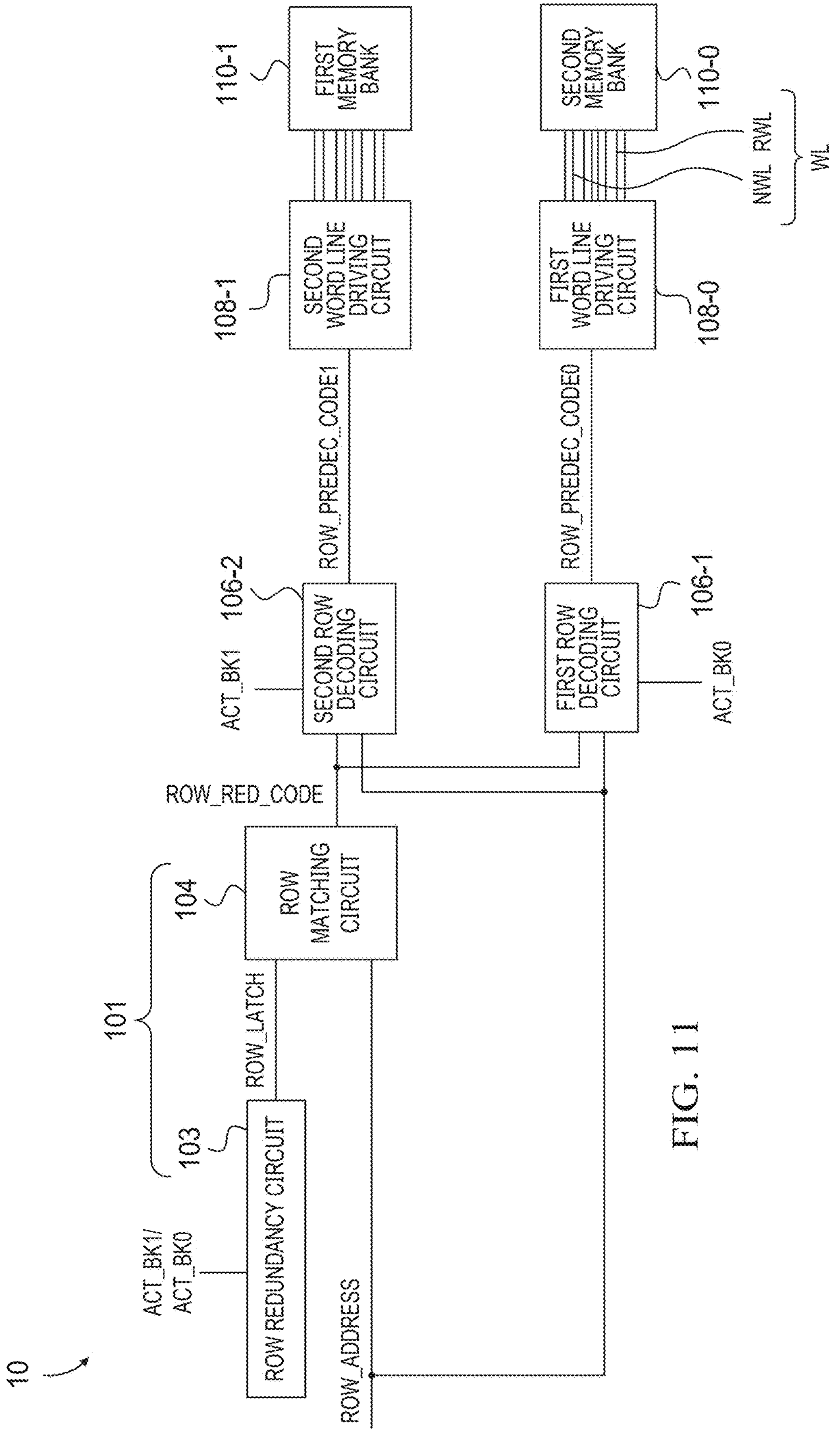
FIG. 11 is a schematic diagram 5 of a redundancy circuit and matching circuit of another memory device provided by an example of the present application.

Referring to FIGS. 10 and 11, in some examples, the redundancy analysis circuit includes a row redundancy analysis circuit, the row redundancy analysis circuit including a row redundancy circuit and a row matching circuit; wherein the row redundancy circuit is configured to: store corresponding invalid row address information for the first memory bank 110-0 and the second memory bank 110-1 respectively, and output an invalid row address signal row_latch, the invalid row address signal row_latch including invalid row address information corresponding to one to-be-activated memory bank from the first memory bank and the second memory bank; the row matching circuit is configured to receive a to-be-activated row address signal row_address, and to match the to-be-activated row address information in the to-be-activated row address signal row_address with the invalid row address information in the invalid row address signal row_latch, and output a matching row signal row_red_code; The decoding circuit includes a row decoding circuit, the row decoding circuit is configured to receive the to-be-activated row address signal row_address and the matching row signal row_red_code, and generate the first row decoding signal row_predec_code/the second row decoding signal row_predec_code0/the third row decoding signal row_predec_code1 according to the to-be-activated row address signal row_address and the matching row signal row_red_code; the first row decoding signal row_predec_code/the second row decoding signal row_predec_code0/the third row decoding signal row_predec_code1 including at least one of to-be-activated row address information or to-be-activated redundancy row address information for the first memory bank/the second memory bank.

Here, referring to FIG. 10, the decoding circuit includes a first decoding circuit, and the first decoding circuit 106-0 may include a first row decoding circuit; referring to FIG. 11, the decoding circuit includes a second decoding circuit and a third decoding circuit, and the second decoding circuit 106-1 may include a second row decoding circuit, and the third decoding circuit 106-2 may include a third row decoding circuit.

Referring to FIG. 10, a row redundancy circuit that stores corresponding invalid row address information for the first memory bank and the second memory bank, according to the enable signal ACT_BK0 of the first memory bank 110-0 being in the enable state, outputs the invalid row address signal row_latch, the invalid row address signal row_latch contains the invalid row address information corresponding to the first memory bank; the row matching circuit matches the to-be-activated row address information in the to-be-activated row address signal row_address with the invalid row address information in the invalid row address signal row_latch, and output a matching row signal row_red_code; the first decoding circuit 106-0 (including the first row decoding circuit) receives the to-be-activated row address signal row_address and the matching row signal row_red_code, and generates the first row decoding signal row_predec_code; the first row decoding signal row_predec_code includes at least one of to-be-activated row address information or to-be-activated redundancy row address information for the first memory bank.

In some examples, the memory device generates the to-be-activated address signal row_address<14:0> according to the command address signal CA<7:0> sent to the first memory bank, and the row redundancy circuit outputs the invalid row address signal row_latch<14:0>, the row matching circuit receives the to-be-activated address signal row_address<14:0> and the invalid row address signal row_latch<14:0>, outputs the matching row signal row_red_code<255:0>, the decoding circuit receives the to-be-activated row address signal row_address<14:0> and the matching row signal row_red_code<255:0>, outputs the first row decoding signal row_predec_code<32768:0>; the first row decoding signal row_predec_code<32768:0> includes a signal for driving the normal word line nwl<32768:0> and the redundancy word line rwl<511:0> of the first memory bank.

It should be noted that the first row decoding signal row_predec_code<32768:0> is for, in the case that redundancy enable is active, when accessing a failure cell based on the to-be-activated address signal row_address<14:0>, automatically switching to access the redundant cell corresponding to the failure cell, that is to say, when redundancy enable is active, access to a failure cell is prohibited and access to the redundant cell corresponding to the failure cell is performed.

Figure 12:
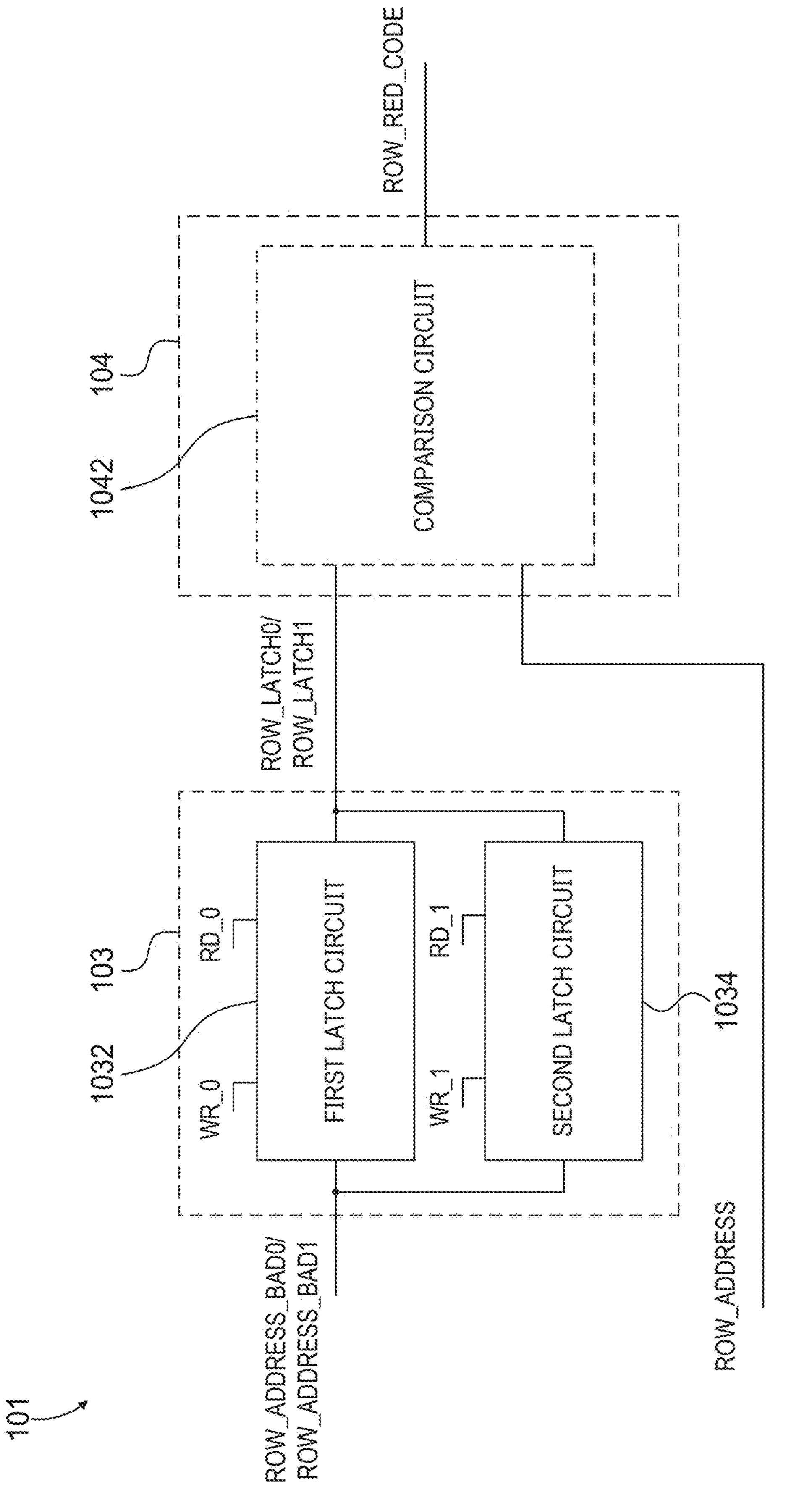
FIG. 12 is a schematic diagram of a redundancy analysis circuit of another memory device provided by an example of the present application.

Referring to FIGS. 10 and 12, or FIGS. 11 and 12, in some examples, the row redundancy circuit 103 includes a first latch circuit 1032 and a second latch circuit 1034; the row matching circuit 104 includes a comparison circuit 1042; the first latch circuit 1032 stores a first invalid row address signal and is configured to output the stored first invalid row address signal row_latch0 in response to an enable state of a first read signal rd_0; or, the second latch circuit 1034 stores a second invalid row address signal and is configured to output the stored second invalid row address signal row_latch1 in response to an enable state of a second read signal rd_1; the comparison circuit 1042 is configured to receive the to-be-activated row address signal row_address and the first invalid row address signal row_latch0/the second invalid row address signal row_latch1, generate the matching row signal row_red_code.

Referring to FIG. 12, in some examples, the first latch circuit 1032 is further configured to store the to-be-stored first invalid row address signal in response to the enable state of the first write signal wr_0; or the second latch circuit 1034 is further configured to store the to-be-stored second invalid row address signal in response to the enable state of the second write signal wr_0.

Referring to FIGS. 10 and 12, or FIGS. 11 and 12, in some examples, the memory device 10 further includes a control circuit (not shown in FIGS. 10, 11 and 12); the control circuit is configured to: generate the first read signal rd_0 in response to an enable signal ACT_BK0 of the first memory bank, or generate the second read signal rd_1 in response to an enable signal ACT_BK1 of the second memory bank.

Referring to FIGS. 10 and 12, or FIGS. 11 and 12, in some examples, the control circuit is further configured to: in response to an invalid row (or failure row) occurring in normal rows in the first memory bank, generate the to-be-stored first invalid row address signal row_latch0 corresponding to the invalid row in the first memory bank and the first write signal wr_0, or in response to an invalid row occurring in normal rows in the second memory bank, generate the to-be-stored second invalid row address signal row_latch1 corresponding to the invalid row in the second memory bank and the second write signal wr_1.

In some examples, an invalid row (or failure row) occurs in normal rows in the first memory bank, and the memory device generates a first invalid row/failure row address signal row_address_bad0 (referring to FIG. 12) and a first write signal wr_0, in response to the enable state of the first write signal wr_0, the first latch circuit 1032 receives the first invalid row/failure row address signal row_address_bad0 and stores the first invalid row address signal row_latch0. An invalid row (or failure row) occurs in normal rows in the second memory bank, and the memory device generates a second invalid row/failure row address signal row_address_bad1 and a second write signal wr_1, in response to the enable state of the second write signal wr_1, the second latch circuit 1034 receives the second invalid row/failure row address signal row_address_bad1 and stores the second invalid row address signal row_latch1.

Figure 13:
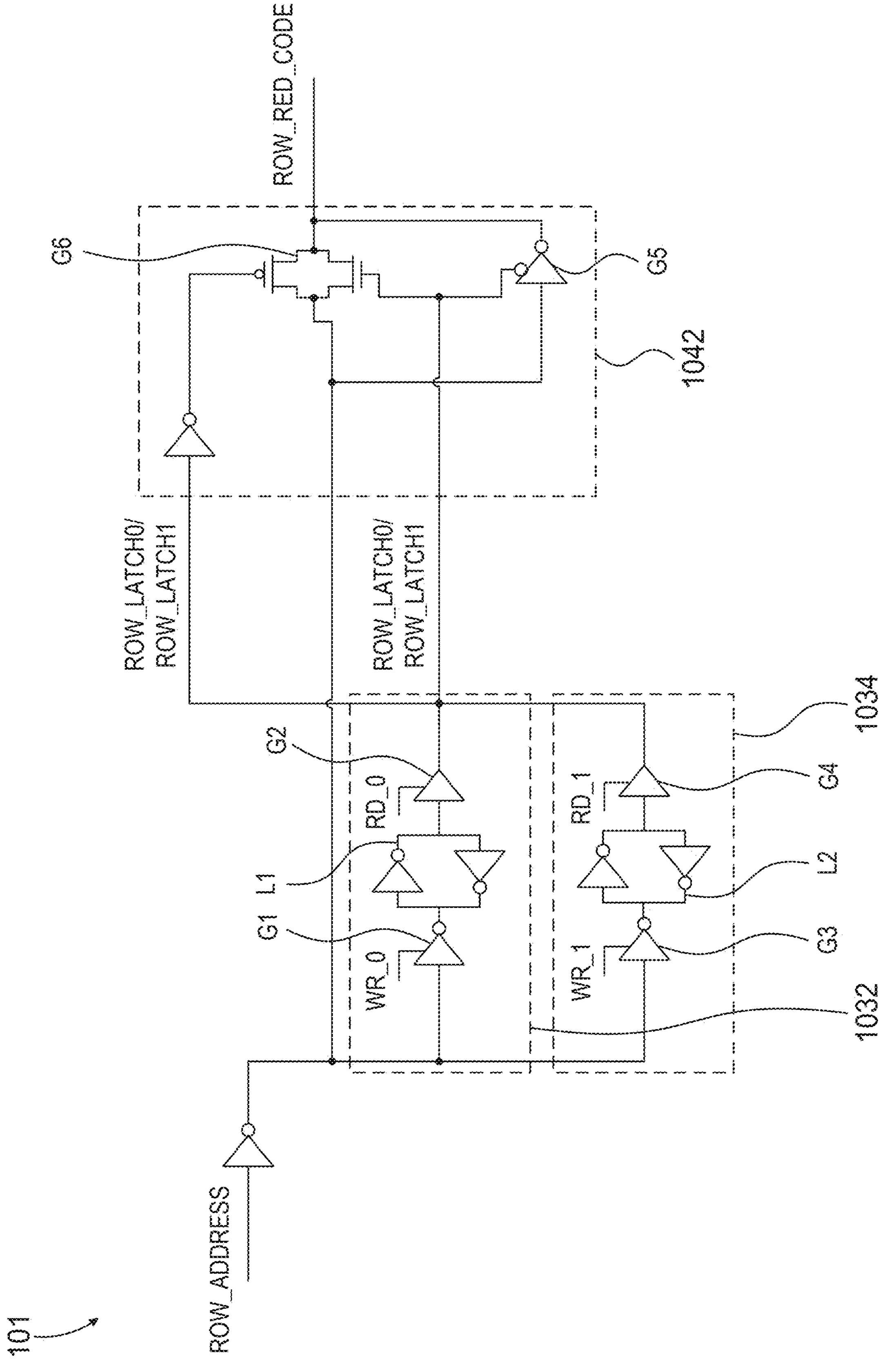
FIG. 13 is a schematic diagram of a redundancy circuit and matching circuit of another memory device provided by an example of the present application.

Referring to FIG. 13, in some examples, the first latch circuit 1032 includes a first gating circuit G1, a first latch L1, and a second gating circuit G2; the second latch circuit 1034 includes a third gating circuit G3, a second latch L2, and a fourth gating circuit G4; the first gating circuit G1 is configured to: receive the to-be-stored first invalid row address signal and the first write signal wr_0, and in response to the enable state of the first write signal wr_0, transmit the to-be-stored first invalid row address signal to the first latch L1; the first latch L1 is configured to receive and store the to-be-stored first invalid row address signal row_latch0/output the stored first invalid row address signal; the second gating circuit G2 is configured to: receive the first invalid row address signal row_latch0 stored by the first latch L1 and the first read signal rd_0, and in response to the enable state of the first read signal rd_0, transmit the first invalid row address signal row_latch0 stored by the first latch to the comparison circuit 1042; or the third gating circuit G3 is configured to: receive the to-be-stored second invalid row address signal and the second write signal wr_1, and in response to the enable state of the second write signal wr_1, transmit the to-be-stored second invalid row address signal to the second latch L2; the second latch L2 is configured to receive and store the to-be-stored second invalid row address signal row_latch0/output the stored second invalid row address signal row_latch1; the fourth gating circuit G4 is configured to: receive the second invalid row address signal stored in the second latch L2 and the second read signal rd_1, and in response to the enable state of the second read signal rd_1, transmit the second invalid row address signal row_latch1 stored by the second latch L2 to the comparison circuit 1042.

The first gating circuit G1 includes an inverter, and the input terminal receives the reverse signal (which may also be understood as the first invalid row address signal row_latch0) of the to-be-activated row address signal row_address (including the first invalid row address information), the control terminal receives the first write signal wr_0, and in response to the enable state of the first write signal wr_0, the output terminal outputs the first invalid row address signal row_latch0. The first latch L1 includes a cross-coupled inverter, the input terminal is connected to the output terminal of the first gating circuit G1, and the output terminal is connected to the input terminal of the second gating circuit G2 for latching the first invalid row address signal row_latch0. The second gating circuit G2 includes an inverter, the input terminal receives the first invalid row address signal row_latch0 latched by the first latch L1, the control terminal receives the first read signal rd_0, and in response to the enable state of the first read signal rd_0, the output terminal outputs the first invalid row address signal row_latch0.

The third gating circuit G3, the second latch L2, and the fourth gating circuit G4 of the second latch circuit may be referred to the description of the specific settings of the first gating circuit G1, the first latch L1, and the second gating circuit G2.

Referring to FIG. 13, in some examples, the comparison circuit 1042 includes a transmission gate G6 and a fifth gating circuit G5; the transmission gate is configured to receive the reverse signal of the to-be-activated row address signal row_address and the first invalid row address signal row_latch0/the second invalid row address signal row_latch1, and generate a first state of the matching row signal row_red_code in response to an enable state of the first invalid row address signal row_latch0/the second invalid row address signal row_latch1; the first state of the matching row signal row_red_code representing an invalid row address matching the first invalid row address/the second invalid row address being included in the to-be-activated row address; the fifth gating circuit is configured to receive a reverse signal of the to-be-activated row address signal row_address and a reverse signal of the first invalid row address signal/the second invalid row address signal, in response to an enable state of the reverse signal of the first invalid row address signal row_latch0/the second invalid row address signal row_latch1, the generated matching row signal row_red_code is in a second state; the second state of the matching row signal row_red_code representing an invalid row address matching the first invalid row address/the second invalid row address not being included in the to-be-activated row address.

The transmission gate G6 includes MOS transistors and MOS transistors connected in parallel, the input terminals of the PMOS transistor and the NMOS transistor receive the reverse signal of the to-be-activated row address signal row_address, the control terminal of the PMOS transistor receives the reverse signal of the first invalid row address signal row_latch0/the second invalid row address signal row_latch1, the control terminal of the NMOS transistor receives the first invalid row address signal row_latch0/the second invalid row address signal row_latch1, and in response to the enable state of the first invalid row address signal row_latch0/the second invalid row address signal row_latch1, the output terminals of the PMOS transistor and the NMOS transistor output the to-be-activated row address signal row_address, that is, the matching row signal row_red_code is in the first state.

The fifth gating circuit G5 includes an inverter, the input terminal receives the reverse signal of the to-be-activated row address signal row_address, and the control terminal receives the reverse signal of the first invalid row address signal row_latch0/the second invalid row address signal row_latch1, and in response to the enable state of the reverse signal of the first invalid row address signal row_latch0/the second invalid row address signal row_latch1, the output terminals output the reverse signal of the to-be-activated row address signal row_address, that is, the matching row signal row_red_code is in the second state.

In some examples, the activated row address signal row_address and the matching row signal row_red_code are of the same number of bits. For example, the redundancy analysis circuit 101 receives n bits of an activated row address signal row_address<n> and outputs n bits of a matching row signal row_red_code<n>, where n is a natural number.

In other examples, the comparison circuit includes a comparator (not shown in FIG. 13) and the comparator is configured to, receive the to-be-activated row address signal row_address and the first invalid row address signal row_latch0/the second invalid row address signal row_latch1, and compare the to-be-activated row address signal row_address with the first invalid row address signal row_latch0/second invalid row address signal row_latch1, and output the matching row signal row_red_code; wherein the first state of the matching row signal row_red_code incl representing an invalid row address matching the first invalid row address/the second invalid row address being included in the to-be-activated row address, the second state of the matching row signal row_red_code representing an invalid row address matching the first invalid row address/the second invalid row address not being included in the to-be-activated row address.

For example, it may be understood by referring to replacing the comparison circuit 1042 in FIG. 13 with a comparator, the first input terminal of the comparator receives the reverse signal of the to-be-activated row address signal row_address, and the second input terminal receives the first invalid row address signal row_latch0/the second invalid row address signal row_latch1, and compare the reverse signal of the to-be-activated row address signal row_address with the first invalid row address signal row_latch0/the second invalid row address signal row_latch1, output a matching row signal row_red_code.

Referring to FIGS. 10 and 11, in some examples, the memory device further includes a first word line driver, a second word line driver, a third word line driver, and a fourth word line driver; the first word line driver is configured to receive the output signal of the decoding circuit, generate a first driving signal; the first driving signal is for driving a normal row in the first memory bank; and/or, the second word line driver is configured to receive the output signal of the decoding circuit, generate a second driving signal; the second driving signal is for driving a redundancy row in the first memory bank; the third word line driver is configured to receive the output signal of the decoding circuit, generate a third driving signal; the third driving signal is for driving a normal row in the second memory bank; and/or, the fourth word line driver is configured to receive the output signal of the decoding circuit, generate a fourth driving signal; the fourth driving signal is for driving a redundancy row in the second memory bank.

The first word line driving circuit 108-0 for driving at least one of the normal row or redundancy row in the first memory bank includes a first word line driver and a second word line driver for controlling the voltage of the selected word line wl connected to at least one of the normal row or the redundancy row in the first memory bank. The second word line driving circuit 108-1 for driving at least one of the normal row or redundancy row in the second memory bank includes a third word line driver and a fourth word line driver for controlling the voltage of the selected word line wl connected to at least one of the normal row or the redundancy row in the second memory bank.

Figure 14:
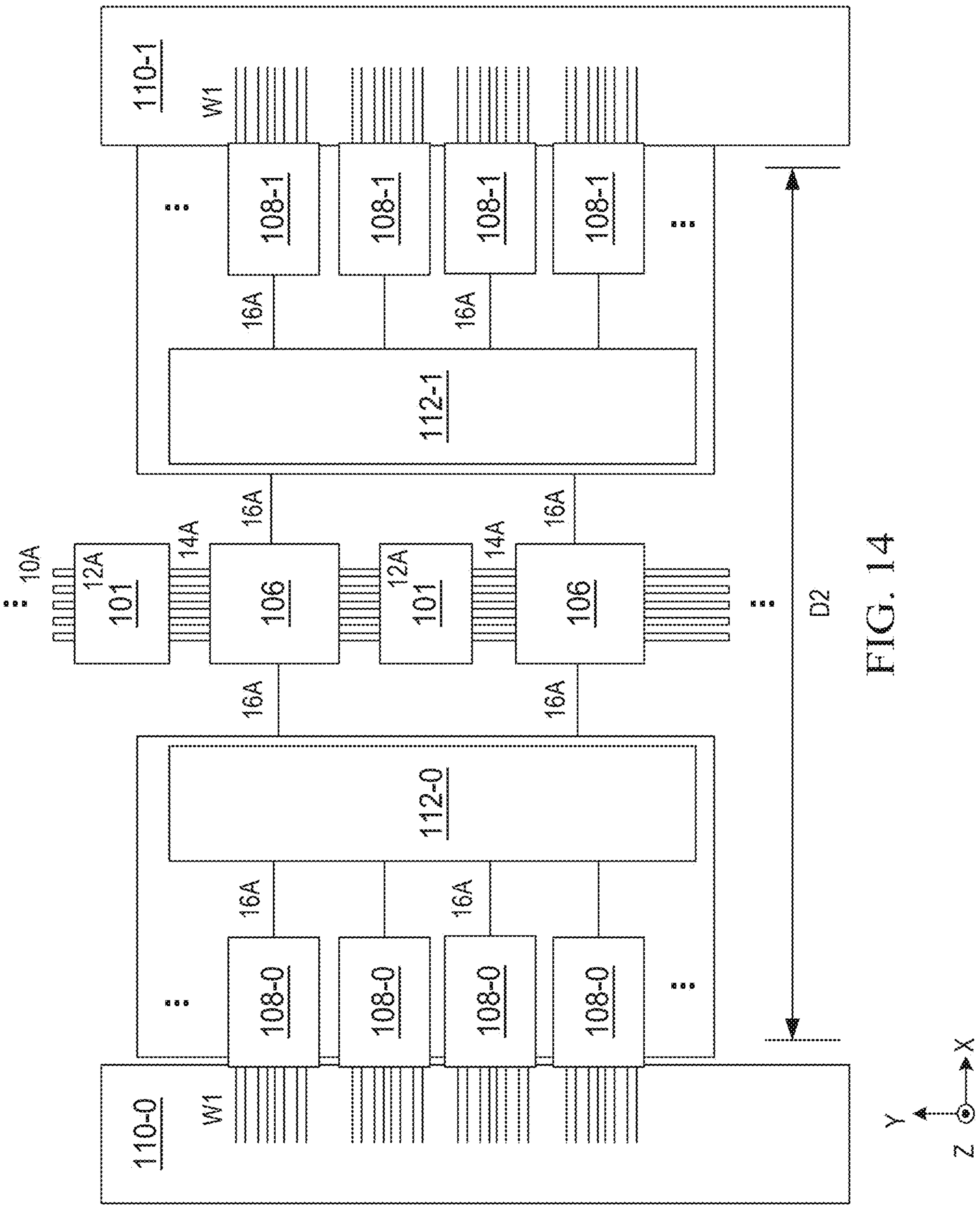
FIG. 14 is a schematic diagram 1 of the plane layout of another memory device provided by an example of the present application.

In a second aspect, an example of the present application provides a memory device, referring to FIGS. 14 and 8, the memory device 10 includes: a first memory bank 110-0 and a second memory bank 110-1 which are arranged adjacently; and a redundancy analysis circuit 101 located between the first memory bank 110-0 and the second memory bank 110-1 and coupled to both the first memory bank 110-0 and the second memory bank 110-1; wherein the redundancy analysis circuit 101 includes: a redundancy circuit 103 which stores invalid address information for the first memory bank 110-0 and the second memory bank 110-1, and is configured to output an invalid address signal 12a according to an enable signal ACT_BK0/ACT_BK1 of the first memory bank 110-0 or the second memory bank 110-1, the invalid address signal 12a includes invalid address information for the first memory bank 110-0 or the second memory bank 110-1; a matching circuit 104 coupled to the redundancy circuit 103 and configured to receive a to-be-activated address signal 10a and the invalid address signal 12a, and match the to-be-activated address information in the to-be-activated address signal 10a with the invalid address information in the invalid address signal 12a, and output a matching address signal 14a.

Referring to FIGS. 14 and 8, in some examples, the memory device 10 further includes a decoding circuit, a first register 112-0, and a second register 112-1; the decoding circuit includes a first decoding circuit 106-0; wherein the first decoding circuit 106-0 is located between the first memory bank 110-0 and the second memory bank 110-1 and coupled to the redundancy analysis circuit 101 and is configured to receive the to-be-activated address signal 10a and the matching address signal 14a, and generate a first decoding signal 16a according to the to-be-activated address signal 10a and the matching address signal 14a; the first decoding signal 16a including at least one of to-be-activated normal address information, or to-be-activated redundancy address information for the first memory bank 110-0/the second memory bank 110-1; the first register 112-0 is located between the redundancy analysis circuit 101, the first decoding circuit 106-0 and the first memory bank 110-0 and coupled to the first decoding circuit 106-0, and is configured to store the first decoding signal 16a in response to the enable signal ACT_BK0 of the first memory bank 110-0 being in an enable state; the second register 112-1 is located between the redundancy analysis circuit 101, the first decoding circuit 106-0 and the first memory bank 110-0 and coupled to the first decoding circuit 106-0, and is configured to store the first decoding signal 16a in response to the enable signal ACT_BK1 of the second memory bank being in an enable state.

Referring to FIG. 3, the first memory bank 110-0 and the second memory bank 110-1 include respective independent decoding circuits located between the first memory bank 110-0 and the second memory bank 110-1, the decoding circuit (e.g., the first redundancy analysis circuit 100-0 and the second redundancy analysis circuit 100-1 therein) occupies a considerable part of the area, resulting in a large first distance D1 between the first memory bank 110-0 and the second memory bank 110-1, thereby hindering improvement in the size of the memory device.

Referring to FIG. 14, the redundancy analysis circuit 101 and the first decoding circuit 106-0 may be used by the first memory bank 110-0 and the second memory bank 110-1 jointly, the occupied area of the redundancy analysis circuit 101 and the first decoding circuit 106-0 located between the first memory bank 110-0 and the second memory bank 110-1 is reduced, the second distance D2 between the first memory bank 110-0 and the second memory bank 110-1 is smaller than the first distance D1 (compare with FIG. 3), thus the size of the memory device is improved.

Compared with the memory device shown in FIG. 4, the redundancy analysis circuit and decoding circuit of a memory device provided by an example of the present application may be used by two memory banks (the first memory bank and the second memory bank) jointly, since the two memory banks share a redundancy analysis circuit and a decoding circuit, the distance between memory banks is reduced.

Referring to FIGS. 14 and 8, in some examples, the memory device 10 further includes a first word line driver and a second word line driver which are located between the first register 112-0 and the first memory bank 110-0, and a third word line driver and a fourth word line driver which are located between the second register 112-1 and the second memory bank 110-1; the first word line driver is configured to receive the output signal of the decoding circuit, generate a first driving signal; the first driving signal is for driving a normal row in the first memory bank; and/or, the second word line driver is configured to receive the output signal of the decoding circuit, generate a second driving signal; the second driving signal is for driving a redundancy row in the first memory bank; the third word line driver is configured to receive the output signal of the decoding circuit, generate a third driving signal; the third driving signal is for driving a normal row in the second memory bank; and/or, the fourth word line driver is configured to receive the output signal of the decoding circuit, generate a fourth driving signal; the fourth driving signal is for driving a redundancy row in the second memory bank.

Figure 15:
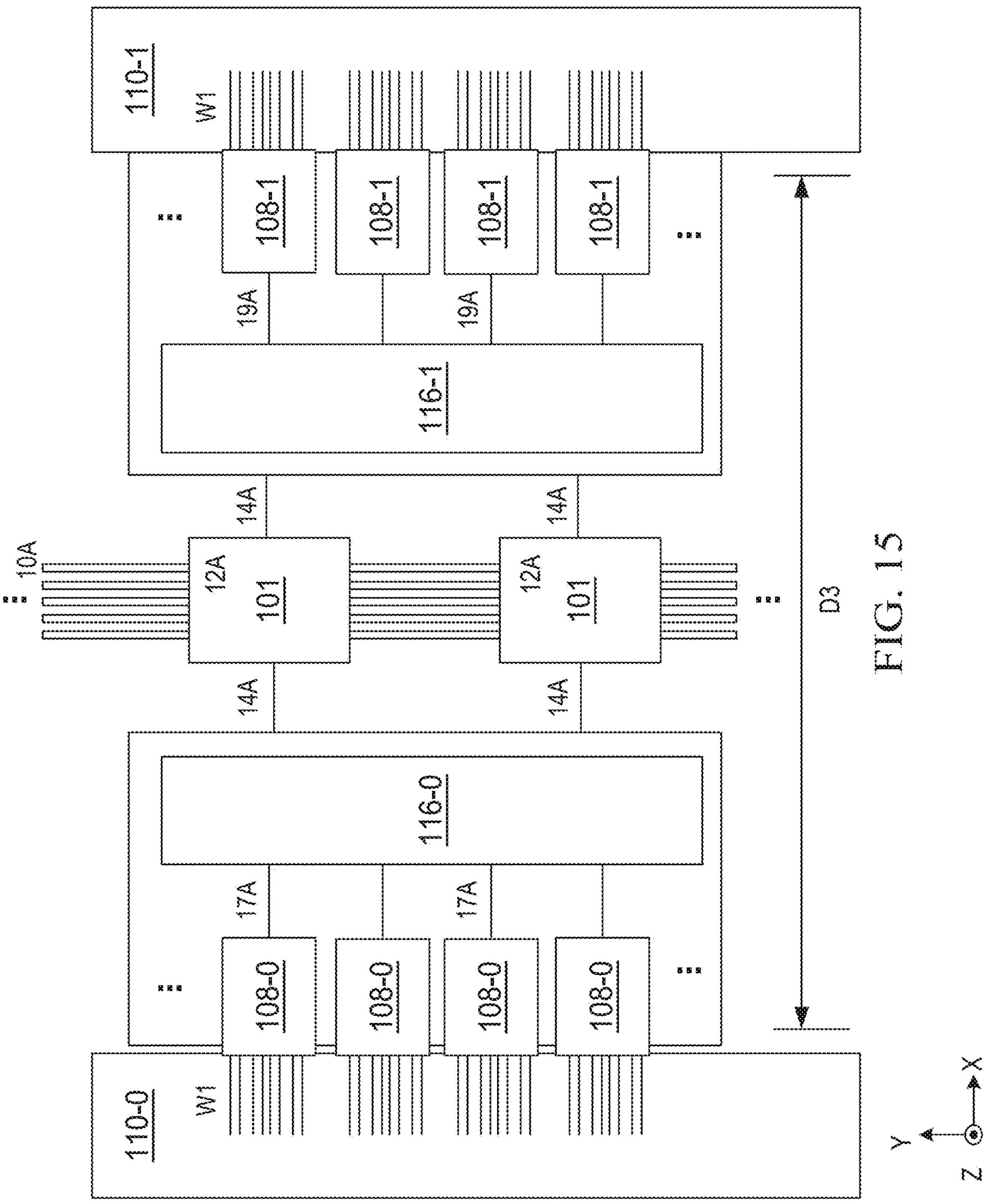
FIG. 15 is a schematic diagram 2 of the plane layout of another memory device provided by an example of the present application.

Referring to FIGS. 15 and 9, in some examples, the memory device 10 further includes a decoding circuit; the decoding circuit includes a second decoding circuit 106-1 and a third decoding circuit 106-2; wherein the second decoding circuit 106-1 is located between the first memory bank 110-0 and the second memory bank 110-1 and coupled to the redundancy analysis circuit 101 and is configured to, in response to the enable signal ACT_BK0 of the first memory bank 110-0 being in the enable state, receive the to-be-activated address signal 10*a* and the matching address signal 14*a*, and generate a second decoding signal 17*a* according to the to-be-activated address signal 10*a* and the matching address signal 14*a*; the second decoding signal 17*a* including at least one of to-be-activated normal address information, or to-be-activated redundancy address information for the first memory bank 110-0; the third decoding circuit 106-2 is located between the first memory bank 110-0 and the second memory bank 110-1 and coupled to the redundancy analysis circuit 101 and is configured to, in response to the enable signal ACT_BK1 of the second memory bank 110-1 being in the enable state, receive the to-be-activated address signal 10*a* and the matching address signal 14*a*, and generate a third decoding signal 19*a* according to the to-be-activated address signal 10*a* and the matching address signal 14*a*; the third decoding signal 19*a* including at least one of to-be-activated normal address information, or to-be-activated redundancy address information for the second memory bank 110-1.

Referring to FIG. 15, the redundancy analysis circuit 101 may be used by the first memory bank 110-0 and the second memory bank 110-1 jointly, the occupied area of the redundancy analysis circuit 101, the second decoding circuit 106-1 and the third decoding circuit 106-2 located between the first memory bank 110-0 and the second memory bank 110-1 is reduced, the third distance D3 between the first memory bank 110-0 and the second memory bank 110-1 is smaller than the first distance D1 (compare with FIG. 3), thus the size of the memory device is improved.

Compared with the memory device shown in FIG. 3, the redundancy analysis circuit of a memory device provided by an example of the present application may be used by two memory banks (the first memory bank and the second memory bank) jointly, since the two memory banks share a redundancy analysis circuit, the distance between memory banks is reduced.

Referring to FIGS. 15 and 9, in some examples, the memory device 10 further includes a first word line driver and a second word line driver which are located between the redundancy analysis circuit 101, the second decoding circuit 106-1 and the first memory bank 110-0, and a third word line driver and a fourth word line driver which are located between the redundancy analysis circuit 101, the third decoding circuit 106-2 and the second memory bank 110-1; the first word line driver is configured to receive the output signal of the decoding circuit, generate a first driving signal; the first driving signal is for driving a normal row in the first memory bank; and/or, the second word line driver is configured to receive the output signal of the decoding circuit, generate a second driving signal; the second driving signal is for driving a redundancy row in the first memory bank; the third word line driver is configured to receive the output signal of the decoding circuit, generate a third driving signal; the third driving signal is for driving a normal row in the second memory bank; and/or, the fourth word line driver is configured to receive the output signal of the decoding circuit, generate a fourth driving signal; the fourth driving signal is for driving a redundancy row in the second memory bank.

In the examples of the present application, on the premise of ensuring that the redundancy analysis function is normal, a redundancy analysis circuit may be used by the first memory bank and the second memory bank of the memory device jointly; and due to circuit multiplexing, area may be saved, distance between memory banks is reduced, thus the size of the memory device may be improved thereby increasing the integration level of the memory device; and reducing a portion of the circuit will reduce the overall power consumption and static leakage of the memory device.

In examples of the present application, one of the two memory banks (e.g., the first memory bank) is activated, and the corresponding first register will store the first decoding signal output by the shared decoding circuit, then select at least one of a specific normal word line or redundancy word line in the first memory bank according to the first decoding signal, to drive at least one of the corresponding normal cell or redundant cell; the second register corresponding to another inactivated memory bank (e.g., the second memory bank) will not latch the first decoding signal output by the decoding circuit to avoid or reduce limitation of the flexibility of redundancy replacement for the first memory bank 110-0 and the second memory bank 110-1 by the first redundancy analysis circuit 100-0, thereby maintaining the flexibility of the redundancy analysis circuit for redundancy replacement.

In some examples, the memory device of any one of the examples described above includes a Dynamic Random Access Memory.

Figure 16:
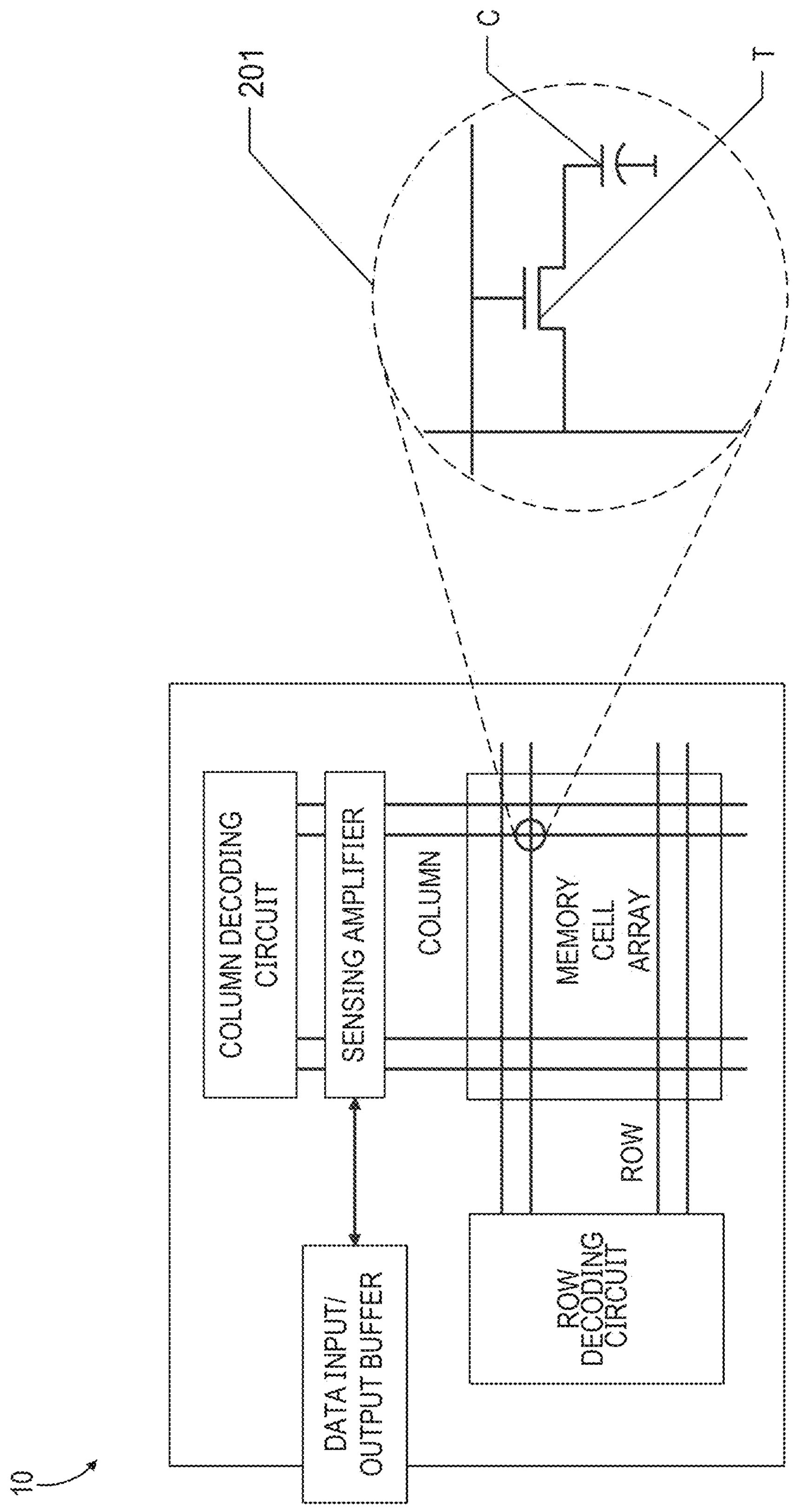
FIG. 16 is a schematic structural diagram of an illustrated dynamic random access memory according to an example of the present application.

FIG. 16 is a schematic structural diagram of an illustrated dynamic random access memory according to an example of the present application. The right side of FIG. 16 shows the circuit of the memory cell in DRAM. DRAM includes at least one DRAM die, each DRAM die includes a memory cell array, the memory cell array includes a plurality of memory cells 201 arranged in an array, and each memory cell 201 includes a transistor T and a capacitor C, the main working principle of the memory cell is to represent whether a binary bit is 1 or 0 with the amount of charge stored in the capacitor. The memory cell array employs a row and a column to specify an address. By specifying an intersection of a row and a column (by specifying a row address and a column address of a DRAM), a memory controller may independently access each memory cell in the DRAM die and perform operations such as read, write or refresh on the data stored in it.

The left side of FIG. 16 shows the memory cell array and some peripheral circuits in DRAM. It should be noted that, in response to the address input to the row decoding circuit, the row decoding circuit selects the word line to select the row in memory cells to be accessed. The row decoding circuit decodes the input address and enables (activates) the word line corresponding to the decoded address. The column decoding circuit selects one or more bit lines to input our output data into the portion of the row in memory cells that corresponds to the selected word line.

Figure 17:
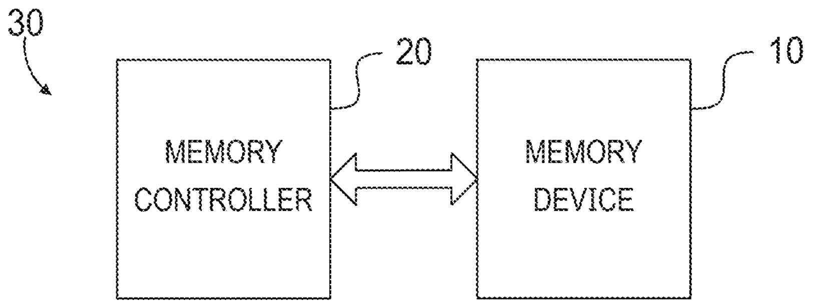
FIG. 17 is a schematic diagram of a memory system provided by an example of the present application.

In a third aspect, an example of the present application provides a memory system, referring to FIG. 17, the memory system 30 includes: one or more memory devices 10 as any one provided in the first aspect; and a memory controller 20 coupled to and controlling the memory device 10.

In some examples, the memory device 10 includes DRAM, Synchronous Dynamic Random-Access Memory (SDRAM) or Double-Data-Rate Fourth Generation Synchronous Dynamic Random Access Memory (DDR4 SDRAM). In some examples, the memory device 10 may also include Static Random-Access Memory (SRAM).

In some examples, memory controller 20 may control overall operations of memory system 30, e.g., write operation, read operation, and refresh operation. In some examples, memory controller 20 is configured to store data into memory device 10 or to read data stored in memory device 10.

In some examples, memory controller 20 is further configured to store various information required for the operation of the memory system 30 (e.g., metadata information and a mapping table) to the memory device 10, and may access the non-volatile memory device based on information stored in the memory device 10.

In a fourth aspect, an example of the present application provides a method for operating a memory device, wherein the memory device includes a first memory bank and a second memory bank, and a redundancy analysis circuit coupled to both the first memory bank and the second memory bank; the operating method includes: by the redundancy circuit of the redundancy analysis circuit, storing invalid address information for the first memory bank and the second memory bank; outputting an invalid address signal according to an enable signal of the first memory bank or the second memory bank, the invalid address signal including invalid address information for the first memory bank or the second memory bank; by the matching circuit of the redundancy analysis circuit coupled to the redundancy circuit, receiving a to-be-activated address signal and the invalid address signal, and matching the to-be-activated address information in the to-be-activated address signal with the invalid address information in the invalid address signal, and output a matching address signal.

In some examples, the operating method further includes: by a first decoding circuit in a decoding circuit coupled to the redundancy analysis circuit, receiving the to-be-activated address signal and the matching address signal, and generating a first decoding signal according to the to-be-activated address signal and the matching address signal; the first decoding signal including at least one of to-be-activated normal address information or to-be-activated redundancy address information for the first memory bank/the second memory bank; in response to the enable signal of the first memory bank, by a first register coupled to the first decoding circuit, storing the first decoding signal; in response to the enable signal of the second memory bank, by a second register coupled to the first decoding circuit, storing the first decoding signal.

In some examples, the operating method includes: the first memory bank is activated in response to the second register completing the storing of the first decoding signal; or the second memory bank is activated in response to the first register completing the storing of the first decoding signal.

In some examples, the operating method further includes: by the redundancy analysis circuit, receiving and storing the first signal, and in response to the first register completing the storing of the third signal, receiving and storing the second signal/the first signal at a next time, by the decoding circuit, generating the fourth signal/the third signal; or by the redundancy analysis circuit, receiving and storing the second signal, and in response to the second register completing the storing of the fourth signal, receiving and storing the first signal/the second signal, by the decoding circuit, generating the third signal/the fourth signal; wherein the to-be-activated address signal includes a first signal or a second signal, and the first signal includes to-be-activated address information for the first memory bank, the second signal includes to-be-activated address information for the second memory bank; the first decoding signal includes a third signal or a fourth signal, the third signal includes at least one of to-be-activated normal address information or to-be-activated redundancy address information for the first memory bank, the fourth signal includes at least one of to-be-activated normal address information or to-be-activated redundancy address information for the second memory bank.

In some examples, the operating method further includes: in response to the enable signal of the first memory bank being in the enable state, by a second decoding circuit in a decoding circuit coupled to the redundancy analysis circuit, receiving the to-be-activated address signal and the matching address signal, and generating a second decoding signal according to the to-be-activated address signal and the matching address signal; the second decoding signal including at least one of to-be-activated normal address information or to-be-activated redundancy address information for the first memory bank; in response to the enable signal of the second memory bank being in the enable state, by a third decoding circuit in a decoding circuit coupled to the redundancy analysis circuit, receiving the to-be-activated address signal and the matching address signal, and generating a third decoding signal according to the to-be-activated address signal and the matching address signal; the third decoding signal including at least one of to-be-activated normal address information or to-be-activated redundancy address information for the second memory bank.

In some examples, the operating method includes: by the row redundancy circuit, storing corresponding invalid row address information for the first memory bank and the second memory bank respectively, and outputting an invalid row address signal, the invalid row address signal including invalid row address information corresponding to one to-be-activated memory bank from the first memory bank and the second memory bank; by the row matching circuit, receiving a to-be-activated row address signal, and matching the to-be-activated row address information in the to-be-activated row address signal with the invalid row address information in the invalid row address signal, and outputting a matching row signal; by a row decoding circuit, receiving the to-be-activated row address signal and the matching row signal, and generating a first row decoding signal/a second row decoding signal/a third row decoding signal according to the to-be-activated row address signal and the matching row signal; the first row decoding signal/the second row decoding signal/the third row decoding signal including at least one of to-be-activated row address information or to-be-activated redundancy row address information for the first memory bank/the second memory bank; wherein the redundancy analysis circuit includes a row redundancy analysis circuit, the row redundancy analysis circuit including a row redundancy circuit and a row matching circuit, the decoding circuit including the row decoding circuit.

In some examples, the operating method includes: in response to the enable state of the first read signal, by the first latch circuit storing the first invalid row address signal outputting the stored first invalid row address signal; or in response to the enable state of the second read signal, by the second latch circuit storing the second invalid row address signal outputting the stored second invalid row address signal; by the comparison circuit, receiving the to-be-activated row address signal and the first invalid row address signal/the second invalid row address signal, and generating the matching row signal; wherein the row redundancy circuit includes a first latch circuit and a second latch circuit; the row matching circuit includes a comparison circuit.

In some examples, the operating method includes: in response to the enable state of the first write signal, by the first latch circuit, storing the to-be-stored first invalid row address signal; or, in response to the enable state of second write signal, by the second latch circuit, storing the to-be-stored second invalid row address signal.

In some examples, the operating method further includes: in response to an enable signal of the first memory bank, by the control circuit, generating the first read signal, or in response to an enable signal of the second memory bank, by the control circuit, generating the second read signal; wherein, the memory device includes a control circuit.

In some examples, the operating method further includes: in response to an invalid row occurring in normal rows in the first memory bank, by the control circuit, generating the to-be-stored first invalid row address signal corresponding to the invalid row in the first memory bank and the first write signal, or, in response to an invalid row occurring in normal rows in the second memory bank, by the control circuit, generating the to-be-stored second invalid row address signal corresponding to the invalid row in the second memory bank and the second write signal.

In some examples, the first latch circuit includes a first gating circuit, a first latch, and a second gating circuit; the second latch circuit includes a third gating circuit, a second latch, and a fourth gating circuit; the operating method further includes: by the first gating circuit, receiving the to-be-stored first invalid row address signal and the first write signal, and in response to the enable state of the first write signal, transmitting the to-be-stored first invalid row address signal to the first latch; by the first latch, receiving and storing the to-be-stored first invalid row address signal/outputting the stored first invalid row address signal; by the second gating circuit, receiving the first invalid row address signal stored in the first latch and the first read signal, and in response to the enable state of the first read signal, transmitting the first invalid row address signal stored in the first latch to the comparison circuit; or, by the third gating circuit, receiving the to-be-stored second invalid row address signal and the second write signal, and in response to the enable state of the second write signal, transmitting the to-be-stored second invalid row address signal to the second latch; by the second latch, receiving and storing the to-be-stored second invalid row address signal/outputting the stored second invalid row address signal; by the fourth gating circuit, receiving the second invalid row address signal stored in the second latch and the second read signal, and in response to the enable state of the second read signal, transmitting the second invalid row address signal stored in the second latch to the comparison circuit.

In some examples, the comparison circuit includes a transmission gate and a fifth gating circuit; the operating method further includes: by the transmission gate, receiving an reverse signal of the to-be-activated row address signal and the first invalid row address signal/the second invalid row address signal, and generating a first state of the matching row signal in response to an enable state of the first invalid row address signal/the second invalid row address signal; the first state of the matching row signal representing an invalid row address matching the first invalid row address/the second invalid row address being included in the to-be-activated row address; by the fifth gating circuit, receiving a reverse signal of the to-be-activated row address signal and a reverse signal of the first invalid row address signal/the second invalid row address signal, in response to an enable state of the reverse signal of the first invalid row address signal/the second invalid row address signal, the generated matching row signal is in a second state; the second state of the matching row signal representing an invalid row address matching the first invalid row address/the second invalid row address not being included in the to-be-activated row address.

In some examples, the memory device further includes a first word line driver, a second word line driver, a third word line driver, and a fourth word line driver; the operating method further includes: by the first word line driver, receiving the output signal of the decoding circuit, generating a first driving signal; the first driving signal being for driving a normal row in the first memory bank; and/or, by the second word line driver, receiving the output signal of the decoding circuit, generating a second driving signal; the second driving signal being for driving a redundancy row in the first memory bank; by the third word line driver, receiving the output signal of the decoding circuit, generating a third driving signal; the third driving signal being for driving a normal row in the second memory bank; and/or, by the fourth word line driver, receiving the output signal of the decoding circuit, generating a fourth driving signal; the fourth driving signal being for driving a redundancy row in the second memory bank.

The memory device used in the method of operating the memory device provided by the example of the fourth aspect of the present application is the same as or similar to the memory device in the example of the first aspect mentioned above, and technical features that are not disclosed in detail in the examples of the present application may be understood with reference to the memory device in each example of the first aspect for understanding, and will not be described again here.

It should be understood that reference throughout the description to "one example" or "an example" means that a particular feature, structure or characteristic related to the example is included in at least one example of the present application. Thus, appearances of "in one example" or "in an example" in various places throughout the description are not necessarily referring to a same example. Furthermore, these particular features, structures or characteristics may be combined in any appropriate manner in one or more examples. It should be understood that in various examples of the present application, sequence numbers of the processes described above do not mean the execution order, and the execution order of each process should be determined by its function and internal logic, and should not constitute any limitation to implementation process of examples of the present application. The serial numbers of examples of the present application described above are for the purpose of description only, and do not represent the advantages and disadvantages of the examples.

The above is only a preferred example of the present application, and does not limit the patent scope of the present application, and under the inventive concept of the present application, any equivalent structural transformation made by using content of the present application and the accompanying drawings, or direct/indirect application in other related technical fields are included in the patent protection scope of the present application.

What is claimed is:

1. A memory device, comprising:

a first memory bank;

a second memory bank; and a redundancy analysis circuit coupled to both the first memory bank and the second memory bank, and including:

a redundancy circuit which stores invalid address information for the first memory bank and the second memory bank, and is configured to: output an invalid address signal according to an enable signal of the first memory bank or the second memory bank, wherein the invalid address signal includes the invalid address information for the first memory bank or the second memory bank; and a matching circuit coupled to the redundancy circuit and configured to: receive a to-be-activated address signal and the invalid address signal, match to-be-activated address information in the to-be-activated address signal with the invalid address information in the invalid address signal, and output a matching address signal.

2. The memory device of claim 1, further comprising:

a decoding circuit including a first decoding circuit which is coupled to the redundancy analysis circuit and configured to:

receive the to-be-activated address signal and the matching address signal; and generate a first decoding signal according to the to-be-activated address signal and the matching address signal, wherein the first decoding signal includes at least one of to-be-activated normal address information or to-be-activated redundancy address information for the first memory bank or the second memory bank;

a first register coupled to the first decoding circuit, and configured to: store the first decoding signal, in response to an enable signal of the first memory bank being in an enable state; and a second register coupled to the first decoding circuit, and configured to: store the first decoding signal in response to an enable signal of the second memory bank being in an enable state.

3. The memory device of claim 2, wherein:

the first memory bank is configured to be activated in response to the second register completing the storing of the first decoding signal; or the second memory bank is configured to be activated in response to the first register completing the storing of the first decoding signal.

4. The memory device of claim 3, wherein:

the to-be-activated address signal includes:

a first signal including to-be-activated address information for the first memory bank; or a second signal including to-be-activated address information for the second memory bank; and the first decoding signal includes:

a third signal including at least one of to-be-activated normal address information or to-be-activated redundancy address information for the first memory bank; or a fourth signal including at least one of to-be-activated normal address information or to-be-activated redundancy address information for the second memory bank;

the redundancy analysis circuit is configured to: receive and store the first signal, and in response to the first register completing a storing of the third signal, receive and store the second signal or the first signal at a next time, and the first decoding circuit is configured to: generate the fourth signal or the third signal; or the redundancy analysis circuit is configured to: receive and store the second signal, and in response to the second register completing a storing of the fourth signal, receive and store the first signal or the second signal, and the first decoding circuit is configured to generate the third signal or the fourth signal.

5. The memory device of claim 1, further comprising:

a decoding circuit, including:

a second decoding circuit coupled to the redundancy analysis circuit and configured to:

receive the to-be-activated address signal and the matching address signal, in response to the enable signal of the first memory bank being in an enable state; and generate a second decoding signal according to the to-be-activated address signal and the matching address signal, wherein the second decoding signal includes at least one of to-be-activated normal address information or to-be-activated redundancy address information for the first memory bank; and a third decoding circuit coupled to the redundancy analysis circuit and configured to:

receive the to-be-activated address signal and the matching address signal, in response to the enable signal of the second memory bank being in an enable state; and generate a third decoding signal according to the to-be-activated address signal and the matching address signal, wherein the third decoding signal includes at least one of to-be-activated normal address information or to-be-activated redundancy address information for the second memory bank.

6. The memory device of claim 2, wherein:

the redundancy analysis circuit includes a row redundancy analysis circuit which includes:

a row redundancy circuit configured to:

store corresponding invalid row address information for the first memory bank and the second memory bank respectively; and output an invalid row address signal, wherein the invalid row address signal includes invalid row address information corresponding to one to-be-activated memory bank from the first memory bank and the second memory bank;

a row matching circuit configured to:

receive a to-be-activated row address signal;

match to-be-activated row address information in the to-be-activated row address signal with the invalid row address information in the invalid row address signal; and output a matching row signal;

the decoding circuit includes a row decoding circuit which is configured to:

receive the to-be-activated row address signal and the matching row signal; and generate a first row decoding signal or a second row decoding signal or a third row decoding signal according to the to-be-activated row address signal and the matching row signal, wherein the first row decoding signal or the second row decoding signal or the third row decoding signal includes at least one of to-be-activated row address information or to-be-activated redundancy row address information for the first memory bank or the second memory bank.

7. The memory device of claim 6, wherein:

the row redundancy circuit includes a first latch circuit, a second latch circuit, the row matching circuit includes a comparison circuit, the first latch circuit stores a first invalid row address signal and is configured to: output the stored first invalid row address signal, in response to an enable state of a first read signal;

the second latch circuit stores a second invalid row address signal and is configured to: output the stored second invalid row address signal, in response to an enable state of a second read signal; and the comparison circuit configured to: receive the to-be-activated row address signal and the first invalid row address signal or the second invalid row address signal, and generate the matching row signal.

8. The memory device of claim 7, wherein:

the first latch circuit is further configured to store a to-be-stored first invalid row address signal, in response to an enable state of a first write signal; or the second latch circuit is further configured to store a to-be-stored second invalid row address signal, in response to an enable state of a second write signal.

9. The memory device of claim 8, further comprising:

a control circuit configured to:

generate the first read signal in response to an enable signal of the first memory bank; or generate the second read signal in response to an enable signal of the second memory bank.

10. The memory device of claim 9, wherein the control circuit is further configured to:

in response to an invalid row occurring in normal rows in the first memory bank, generate the to-be-stored first invalid row address signal corresponding to the invalid row in the first memory bank and the first write signal; or in response to an invalid row occurring in normal rows in the second memory bank, generate the to-be-stored second invalid row address signal corresponding to the invalid row in the second memory bank and the second write signal.

11. The memory device of claim 10, wherein:

the first latch circuit includes a first gating circuit, a first latch, and a second gating circuit; the second latch circuit includes a third gating circuit, a second latch, and a fourth gating circuit;

wherein, the first gating circuit is configured to: receive the to-be-stored first invalid row address signal and the first write signal, and in response to the enable state of the first write signal, transmit the to-be-stored first invalid row address signal to the first latch; the first latch is configured to: receive and store the to-be-stored first invalid row address signal or output the stored first invalid row address signal; and the second gating circuit is configured to: receive the first invalid row address signal stored in the first latch and the first read signal, and in response to the enable state of the first read signal, transmit the first invalid row address signal stored in the first latch to the comparison circuit; or the third gating circuit is configured to: receive the to-be-stored second invalid row address signal and the second write signal, and in response to the enable state of the second write signal, transmit the to-be-stored second invalid row address signal to the second latch; the second latch is configured to: receive and store the to-be-stored second invalid row address signal or output the stored second invalid row address signal; and the fourth gating circuit is configured to: receive the second invalid row address signal stored in the second latch and the second read signal, and in response to the enable state of the second read signal, transmit the second invalid row address signal stored in the second latch to the comparison circuit.

12. The memory device of claim 10, wherein the comparison circuit includes:

a transmission gate configured to:

receive a reverse signal of the to-be-activated row address signal and the first invalid row address signal or the second invalid row address signal; and generate a first state of the matching row signal, in response to an enable state of the first invalid row address signal or the second invalid row address signal, wherein the first state of the matching row signal represents an invalid row address matching the first invalid row address or the second invalid row address being included in the to-be-activated row address; and a fifth gating circuit configured to:

receive a reverse signal of the to-be-activated row address signal and a reverse signal of the first invalid row address signal or the second invalid row address signal; and generate a second state of the matching row signal, in response to an enable state of the reverse signal of the first invalid row address signal or the second invalid row address signal, wherein the second state of the matching row signal represents an invalid row address matching the first invalid row address or the second invalid row address not being included in the to-be-activated row address.

13. The memory device of claim 5, further comprising: a first word line driver, a second word line driver, a third word line driver and a fourth word line driver, wherein:

the first word line driver is configured to: receive an output signal of the decoding circuit, and generate a first driving signal for driving a normal row in the first memory bank; and the second word line driver is configured to: receive an output signal of the decoding circuit, and generate a second driving signal for driving a redundancy row in the first memory bank;

the third word line driver is configured to: receive an output signal of the decoding circuit, and generate a third driving signal for driving a normal row in the second memory bank; and the fourth word line driver is configured to: receive an output signal of the decoding circuit, and generate a fourth driving signal for driving a redundancy row in the second memory bank.

14. A memory system, comprising:

one or more memory devices, each comprising:

a first memory bank;

a second memory bank; and a redundancy analysis circuit coupled to both the first memory bank and the second memory bank, and including:

a redundancy circuit which stores invalid address information for the first memory bank and the second memory bank, and is configured to: output an invalid address signal according to an enable signal of the first memory bank or the second memory bank, wherein the invalid address signal includes the invalid address information for the first memory bank or the second memory bank; and a matching circuit coupled to the redundancy circuit and configured to: receive a to-be-activated address signal and the invalid address signal, match to-be-activated address information in the to-be-activated address signal with the invalid address information in the invalid address signal, and output a matching address signal; and a memory controller coupled to the memory devices and configured to control the memory devices.

15. A method for operating a memory device, wherein the memory device includes a first memory bank and a second memory bank, and a redundancy analysis circuit coupled to both the first memory bank and the second memory bank, the method comprising:

by a redundancy circuit of the redundancy analysis circuit, storing invalid address information for the first memory bank and the second memory bank, outputting an invalid address signal according to an enable signal of the first memory bank or the second memory bank, the invalid address signal including the invalid address information for the first memory bank or the second memory bank; and by a matching circuit of the redundancy analysis circuit coupled to the redundancy circuit, receiving a to-be-activated address signal and the invalid address signal, matching to-be-activated address information in the to-be-activated address signal with the invalid address information in the invalid address signal, and outputting a matching address signal.

16. The method of claim 15, further comprising:

by a first decoding circuit in a decoding circuit coupled to the redundancy analysis circuit, receiving the to-be-activated address signal and the matching address signal, and generating a first decoding signal according to the to-be-activated address signal and the matching address signal, wherein the first decoding signal includes at least one of to-be-activated normal address information or to-be-activated redundancy address information for the first memory bank or the second memory bank;

by a first register coupled to the first decoding circuit, storing the first decoding signal, in response to the enable signal of the first memory bank; and by a second register coupled to the first decoding circuit, storing the first decoding signal, in response to the enable signal of the second memory bank.

17. The method of claim 16, further comprising:

the first memory bank is activated in response to the second register completing the storing of the first decoding signal; or the second memory bank is activated in response to the first register completing the storing of the first decoding signal.

18. The method of claim 16, further comprising:

by the redundancy analysis circuit, receiving and storing a first signal, and in response to the first register completing storing of a third signal, receiving and storing a second signal or the first signal at a next time, and generating a fourth signal or the third signal by the first decoding circuit; or by the redundancy analysis circuit, receiving and storing the second signal, and in response to the second register completing storing of the fourth signal, receiving and storing the first signal or the second signal, and generating the third signal or the fourth signal by the first decoding circuit, wherein the to-be-activated address signal includes the first signal or the second signal, the first signal includes to-be-activated address information for the first memory bank, and the second signal includes to-be-activated address information for the second memory bank; the first decoding signal includes the third signal or the fourth signal, the third signal includes at least one of the to-be-activated normal address information or the to-be-activated redundancy address information for the first memory bank, and the fourth signal includes at least one of the to-be-activated normal address information or the to-be-activated redundancy address information for the second memory bank.

19. The method of claim 15, further comprising:

by a second decoding circuit in a decoding circuit coupled to the redundancy analysis circuit, receiving the to-be-activated address signal and the matching address signal in response to the enable signal of the first memory bank being in an enable state, and generating a second decoding signal according to the to-be-activated address signal and the matching address signal, wherein the second decoding signal includes at least one of to-be-activated normal address information or to-be-activated redundancy address information for the first memory bank; and by a third decoding circuit in a decoding circuit coupled to the redundancy analysis circuit, receiving the to-be-activated address signal and the matching address signal in response to the enable signal of the second memory bank being in an enable state, and generating a third decoding signal according to the to-be-activated address signal and the matching address signal, wherein the third decoding signal includes at least one of to-be-activated normal address information or to-be-activated redundancy address information for the second memory bank.

20. The method of claim 16, further comprising:

by a row redundancy circuit, storing corresponding invalid row address information for the first memory bank and the second memory bank respectively, and outputting an invalid row address signal, wherein the invalid row address signal includes invalid row address information corresponding to one to-be-activated memory bank from the first memory bank and the second memory bank;

by a row matching circuit, receiving a to-be-activated row address signal, matching to-be-activated row address information in the to-be-activated row address signal with the invalid row address information in the invalid row address signal, and outputting a matching row signal; and by a row decoding circuit, receiving the to-be-activated row address signal and the matching row signal, and generating a first row decoding signal or a second row decoding signal or a third row decoding signal according to the to-be-activated row address signal and the matching row signal, wherein the first row decoding signal or the second row decoding signal or the third row decoding signal includes at least one of to-be-activated row address information or to-be-activated redundancy row address information for the first memory bank or the second memory bank, wherein the redundancy analysis circuit includes a row redundancy analysis circuit including the row redundancy circuit and the row matching circuit, and the decoding circuit includes the row decoding circuit.

* * * * *